United States Patent
Watanabe et al.

(10) Patent No.: US 6,421,291 B1
(45) Date of Patent: Jul. 16, 2002

(54) SEMICONDUCTOR MEMORY DEVICE HAVING HIGH DATA INPUT/OUTPUT FREQUENCY AND CAPABLE OF EFFICIENTLY TESTING CIRCUIT ASSOCIATED WITH DATA INPUT/OUTPUT

(75) Inventors: Naoya Watanabe; Yoshikazu Morooka, both of Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/510,532

(22) Filed: Feb. 22, 2000

(30) Foreign Application Priority Data

Jul. 29, 1999 (JP) ............................... 11-215022

(51) Int. Cl.[7] ................................................ G11C 7/00
(52) U.S. Cl. .......................... 365/219; 365/220; 365/221
(58) Field of Search ................................... 365/219, 220, 365/221, 189.01, 189.12, 230.09, 230.08, 207, 189.04, 52

(56) References Cited

U.S. PATENT DOCUMENTS 5,309,387 A * 5/1994 Mori ............................ 365/52
5,508,967 A * 4/1996 Rarino ........................ 365/219
5,619,466 A * 4/1997 McClure ..................... 365/207

FOREIGN PATENT DOCUMENTS

| JP | 355011627 A | * 1/1980 | ............. H04L/5/14 |
| JP | 4-103093 | 4/1992 | |

* cited by examiner

Primary Examiner—David Nelms
Assistant Examiner—David Lam
(74) Attorney, Agent, or Firm—McDermott, Will & Emery

(57) ABSTRACT

A data input/output circuit includes an S/P data conversion circuit which converts serial data input to a data terminal into a parallel data and transmits the parallel data to write data lines, a P/S data conversion circuit which converts parallel data on read data lines to serial data and outputs the serial data to the data terminal, and an input/output test circuit placed between the write data lines and the read data lines. The input/output test circuit responds to an input/output test signal to directly transfer data on the write data lines respectively to the read data lines without passing them through a memory cell array.

27 Claims, 16 Drawing Sheets

SEMICONDUCTOR MEMORY DEVICE HAVING HIGH DATA INPUT/OUTPUT FREQUENCY AND CAPABLE OF EFFICIENTLY TESTING CIRCUIT ASSOCIATED WITH DATA INPUT/OUTPUT

BACKGROUND OF THE INVENTION

1. Field of the Invention

The present invention relates to semiconductor memory devices and particularly to a semiconductor memory device having data input/output frequency which is higher than internal operating frequency and capable of efficiently testing a data input/output circuit.

2. Description of the Background Art

In the last few years, the enhanced operating frequency of the microprocessor requires increased data bandwidth of a semiconductor memory device. Techniques which have been published for increasing the data bandwidth are to double the width of the data bus, to enhance clock frequency of a synchronous semiconductor memory device and the like. As a technique for enhancing data frequency, a synchronous semiconductor memory device has been proposed which inputs/outputs data synchronously with both of the rising and falling of a clock signal. Further, a high speed interface technique has been published which makes the frequency of a synchronous clock used for supplying and receiving input/output data to and from any external unit at least four times as high as internal operating frequency of a synchronous semiconductor memory device.

Description is herein presented on a structure of a data input/output circuit in a semiconductor memory device having its data input/output frequency which is four times as high as internal operating frequency.

FIG. 15 is a block diagram showing a structure of a data input/output circuit 100 of a semiconductor memory device having its data input/output frequency which is four times as high as internal operating frequency.

Referring to FIG. 15, data input/output circuit 100 inputs and outputs four consecutive data DQ via a one-bit data terminal 10 synchronously with external clock signal ext.CLK which is supplied to a clock terminal 16.

Data input/output circuit 100 operates in synchronization with internal clock signals CLKD and CLKQ and internal frequency-divided clock signals clkA to clkD which are generated by an internal clock generating circuit 30.

Data input/output circuit 100 includes an S/P data conversion circuit 130 which converts serial input data Din supplied via a data input buffer 115 into parallel data synchronously with internal frequency-divided clock signals clkA to clkD to transmit them to four write data lines WDa to WDd, and a write circuit 162 which writes the input data transmitted to write data lines WDa to WDd into a memory cell array 50 in parallel in response to activation of write control signal WE.

Data input/output circuit 100 further includes a read circuit 164 which reads four data in parallel from memory cell array 50 to transmit them to read data lines RDa to RDd, a P/S data conversion circuit 140 which converts four parallel data into serial data Dout in synchronization with internal frequency-divided clock signals clkA to clkD, and a data output buffer 120 which supplies output data Dout of a P/S data conversion circuit 140 to data terminal 10.

Data input/output circuit 100 thus makes an internal serial-parallel conversion of serial data which are input and output from the data terminal and performs reading and writing operations of the parallel data all together from and into the memory cell array so as to enhance the data input/output frequency relative to the internal operating frequency.

An operation of data input/output circuit 100 is now described in conjunction with a timing chart.

FIG. 16 is the timing chart illustrating a data input operation carried out by data input/output circuit 100.

Referring to FIG. 16, in the data input operation, four consecutive data D0 to D3 are supplied to one-bit data terminal 10 synchronously with both of the falling and rising of external clock signal ext.CLK.

Internal clock generating circuit 30 responds to external clock signal ext.CLK to generate internal clock signal CLKD. Internal clock signal CLID is activated in response to both of the rising and falling of external clock signal ext.CLK and has its frequency two times as high as the external clock signal. In response to activation of internal clock signal CLKD, input data DQ supplied to the data terminal is taken by the data input buffer.

Internal clock generating circuit 30 further generates internal frequency-divided clock signals clkA to clkD by dividing the frequency of internal clock signal CLKD. The frequency of internal frequency-divided clock signals clkA to clkD is half the frequency of internal clock signal CLKD and the phases thereof are shifted by one cycle of internal clock signal CLKD.

S/P data conversion circuit 130 operates in response to internal frequency-divided clock signals clkA to clkD to transmit input data D0 to D3 to write data lines WDa to WDd respectively at time t0 to time t3. Accordingly, the four input data consecutively supplied to one-bit data terminal 10 undergo serial-parallel conversion to become four-bit parallel data which are transmitted by four internal write data lines.

After time t3 at which the fourth input data D3 is transmitted to write data line WDd, at time t4, write control signal WE is activated and write circuit 162 transmits the data transmitted to write data lines WDa to WDd to memory cell data lines MIOa to MIOd respectively. The four-bit parallel data are thus written into the memory cell array simultaneously.

The frequency of write control signal corresponds to the internal operating frequency of the synchronous semiconductor memory device. The frequency of internal clock signal CLKD which is the data input frequency is seen four times as high as the internal operating frequency.

A problem which arises when the data input/output frequency becomes high is described below.

FIG. 17 is a timing chart illustrating data input timing when the data input/output frequency is equal to the internal operating frequency.

Referring to FIG. 17, in response to activation of external clock signal ext.CLK at time t0, data D2 transmitted to the data terminal is input.

In this case, setup time Ts and hold time Th are ensured respectively, and thus there is a relatively large margin for data input/output timing.

FIG. 18 is a timing chart illustrating data input timing when the data input frequency is four times as high as the internal operating frequency.

Referring to FIG. 18, the data input frequency is defined as four times as high as that illustrated in FIG. 17. Therefore, when data D2 is input in response to activation of external clock signal ext.CLK at time to, setup time and hold time are ensured to correspond to only ts and th respectively as shown.

If the data input frequency is increased, the setup and hold time for data relative to the clock signal are shortened, resulting in decrease in margin of data input/output timing. Accordingly, a resultant problem is increase in rate of defect occurrence in the data input/output circuit. It is then required to do an efficient operation test by immediately detecting any defect in the data input/output circuit.

In a conventional synchronous semiconductor memory device, a data input/output circuit operates at a low frequency which is identical to that of an internal clock signal used as a reference for an internal operation. Therefore, defect is rarely found in the data input/output circuit and thus a dedicated test circuit for the data input/output circuit is unnecessary.

However, if the data input/output frequency is increased and the possibility of occurrence of defect in the data input/output circuit becomes higher, it takes a long time to discover the cause of the defect and an efficient operation test could become impossible unless a dedicated circuit for testing the data input/output circuit is provided.

SUMMARY OF THE INVENTION

The present invention is made to solve the problems as described above. One object of the present invention is to provide a structure of a semiconductor memory device, which operates at a data input/output frequency higher than an internal operating frequency, so as to enable an operation test of a data input/output circuit to be done efficiently.

According to one aspect of the present invention, a semiconductor memory device is provided which internally converts serial data supplied to and from any external unit into parallel data and performs reading and writing operations thereof. The semiconductor memory device includes a memory cell array, a data terminal and a data input/output circuit.

The memory cell array includes a plurality of memory cells arranged in rows and columns. The data terminal inputs and outputs N data (N: natural number) which are transmitted in time series manner. The data input/output circuit includes, for the memory cell array, N write data lines and N read data lines provided for writing and reading N data and transmitting N data in parallel, a first data conversion circuit which converts N serial data input from the data terminal into N parallel data to transmit them to the write data lines, a second data conversion circuit which converts N parallel data transmitted by the read data lines into N serial output data to be output from the data terminal, a read and write circuit for supplying and receiving N data all together between N write data lines and the memory cell array and between N read data lines and the memory cell array, and an input/output test circuit which transfers data transmitted by N write data lines respectively to N read data lines in an input/output test operation.

According to another aspect of the invention, a semiconductor memory device is provided which internally converts serial data supplied to and from any external unit into parallel data and performs reading and writing operations thereof. The semiconductor memory device includes a memory cell array, a plurality of data terminals, a plurality of data input/output circuits and a plurality of input/output test circuits.

The memory cell array includes a plurality of memory cells arranged in rows and columns. A plurality of data terminals each independently input and output N data (N: natural number) which are transmitted in time series manner. A plurality of data input/output circuits are arranged respectively for the data terminals and each read and write N data from and into the memory cell array. Each of the data input/output circuits includes N write data lines and N read data lines for transmitting N data in parallel, a first data conversion circuit which converts N serial data supplied from an associated one of the data terminals into N parallel data to transmit them to the write data lines, a second data conversion circuit which converts N parallel data transmitted by the read data lines into N serial output data to be output from the associated data terminal, and a read and write circuit for supplying and receiving N data all together between N write data lines and the memory cell array and between N read data lines and the memory cell array.

A plurality of input/output test circuits are each arranged between one of the data input/output circuits and another one of the data input/output circuits to transfer, in an input/output test operation, data transmitted by N write data lines included in the one of the data input/output circuits respectively to N read data lines included in the another one of the data input/output circuits.

According to still another aspect of the invention, a semiconductor memory device is provided which internally converts serial data supplied to and from any external unit into parallel data and performs reading and writing operations thereof The semiconductor memory device includes a memory cell array, a plurality of data terminals, a control circuit, a plurality of data input/output circuits and an input/output test circuit.

The memory cell array includes a plurality of memory cells arranged in rows and columns. A plurality of data terminals each independently input and output N data (N: natural number) which are transmitted in time series manner. The control circuit generates L control signals (L: natural number) for controlling timing of the reading and writing operations. A plurality of data input/output circuits are arranged respectively for the data terminals and each read and write N data from and into the memory cell array. Each of the data input/output circuits includes N write data lines and N read data lines for transmitting N data in parallel, a first data conversion circuit which converts N serial data input from an associated one of the data terminals into N parallel data to transmit them to the write data lines, a second data conversion circuit which converts N parallel data transmitted from the read data lines into N serial data to be output from the associated data terminal, a read and write circuit for supplying and receiving N data all together between N write data lines and the memory cell array and between N data read lines and the memory cell array, and an output buffer circuit for outputting. data of the second data conversion circuit to the associated one of the data terminals in the reading operation, and outputting test data to the associated one of the data terminals in an input/output test operation. The input/output test circuit transmits as test data, in the input/output test operation, N data transmitted by N write data lines included in one of the data input/output circuits and M control signals (M: natural number equal to or less than L) respectively to the output buffer circuits respectively included in remaining N+M data input/output circuits among the data input/output circuits.

A principal advantage of the present invention is that the input/output circuit can be tested without performing data reading and writing from and into a memory cell so that the input/output circuit can be tested without using a memory tester.

Further, since the input/output circuit can be tested using at least N consecutive data trains, evaluation of a test such as evaluation of operating frequency is possible regarding data input in a memory system configured by using the semiconductor memory device.

In addition, in input/output test operation, control signals and data signals can be output from the data terminals, so that inappropriate timing of the control signals can be detected.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
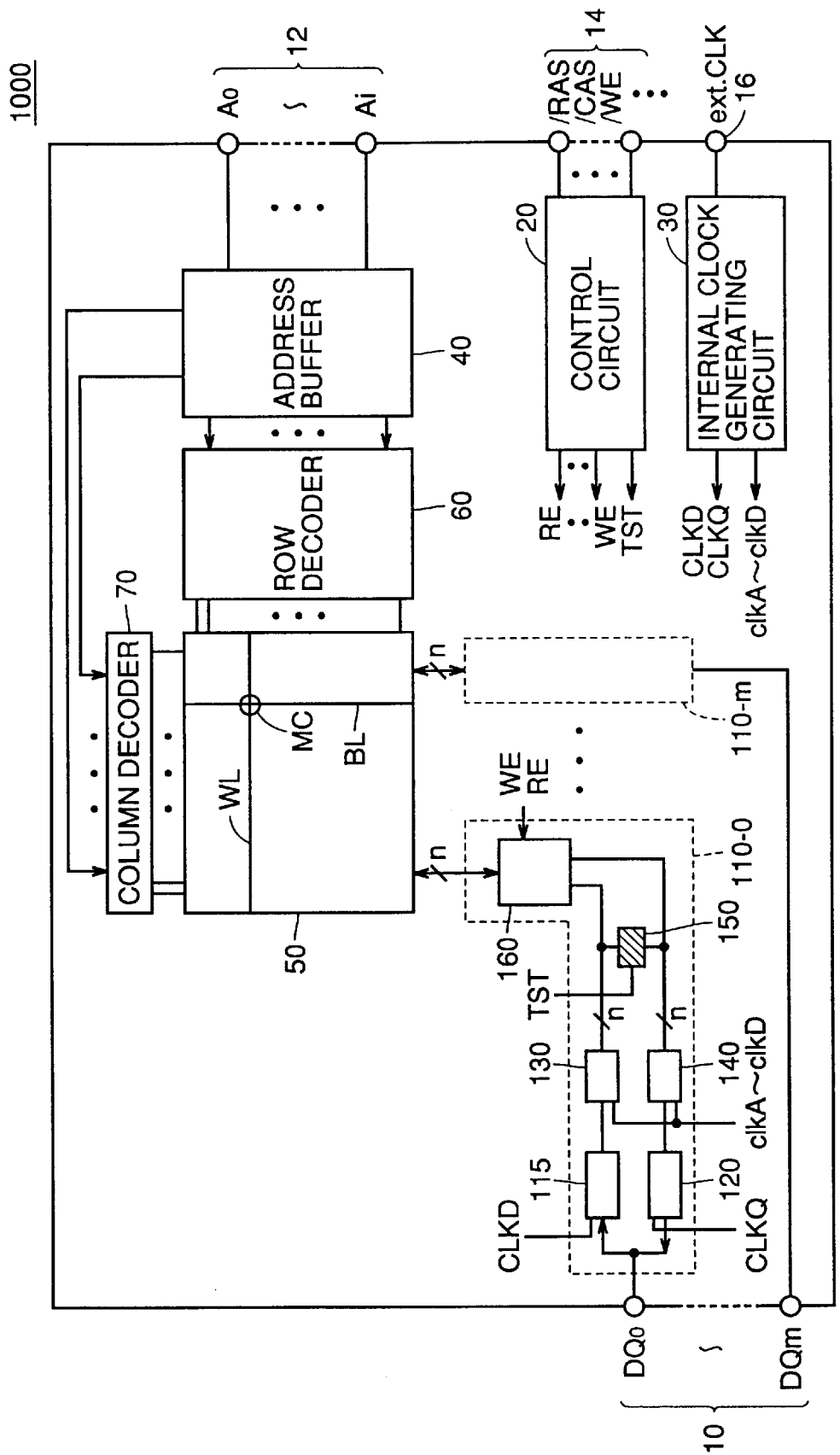
FIG. 1 is a schematic block diagram illustrating an entire structure of a semiconductor memory device 1000 in a first embodiment of the invention.

Embodiments of the present invention are hereinafter described in detail in conjunction with the attached drawings. It is noted that the same reference character denotes the same or corresponding components.

First Embodiment

FIG. 1 is a schematic block diagram illustrating an entire structure of a semiconductor memory device 1000 in the first embodiment of the present invention.

Referring to FIG. 1, semiconductor memory device 1000 includes a group of data terminals 10 for supplying and receiving input/output data DQ0 to DQm (m: natural number), a group of address signal terminals 12 for receiving address signals A0 to Ai (i: natural number), a group of control signal terminals 14 for receiving control signals such as /RAS, /CAS and /WE, and a clock terminal 16 for receiving external clock signal ext.CLK.

Semiconductor memory device 1000 further includes a memory cell array 50 having a plurality of memory cells which are arranged in rows and columns. Memory cell array 50 includes a word line WL arranged for each row of the memory cells, and a bit line BL arranged for each row of the memory cells. At a crossing of word line WL and bit line BL, a memory cell MC is placed. In FIG. 1, an arrangement of word line WL and bit line BL associated with one memory cell MC is representatively shown. In response to address signals A0 to Ai transmitted via an address buffer 40, a row decoder 60 and a column decoder 70 respectively select a row and a column of the memory cells.

Semiconductor memory device 1000 further includes a control circuit 20 which receives from the control signal input terminals control signals such as row address strobe signal /RAS, column address strobe signal /CAS and write enable signal /WE and generates internal control signals such :as read control signal RE, write control signal WE and input/output circuit test signal TST, and includes an internal clock generating circuit 30 which receives external clock signal ext.CLK and generates internal clock signals CLKD and CLKQ and internal frequency-divided clock signals clkA to clkD.

Semiconductor memory device 1000 further includes data input/output circuits 110-0 to 110-m respectively associated with the data terminals. In semiconductor memory device 1000, in one reading operation and in one writing operation, n (n: natural number) consecutive data are supplied and received by each data terminal.

Data input/output circuits 110-0 to 110-m each have a function of making serial-parallel conversion of data, and accordingly convert n consecutive data input from the data terminal into parallel data to simultaneously write them in parallel into memory cell array 50 and convert n parallel data read from memory cell array 50 into. n serial consecutive data to output them from the data terminal.

A plurality of data of n in number which are consecutively input and output by the data terminal are thus read from and written into memory cell array 50 all together, so that the frequency of data input/output can be set n times as high as internal operating frequency.

In the description of this embodiment presented below, a specific circuit structure is illustrated as one example which inputs and outputs four data all together to and from the memory cell array, that is, in the case of n=4.

Figure 2:
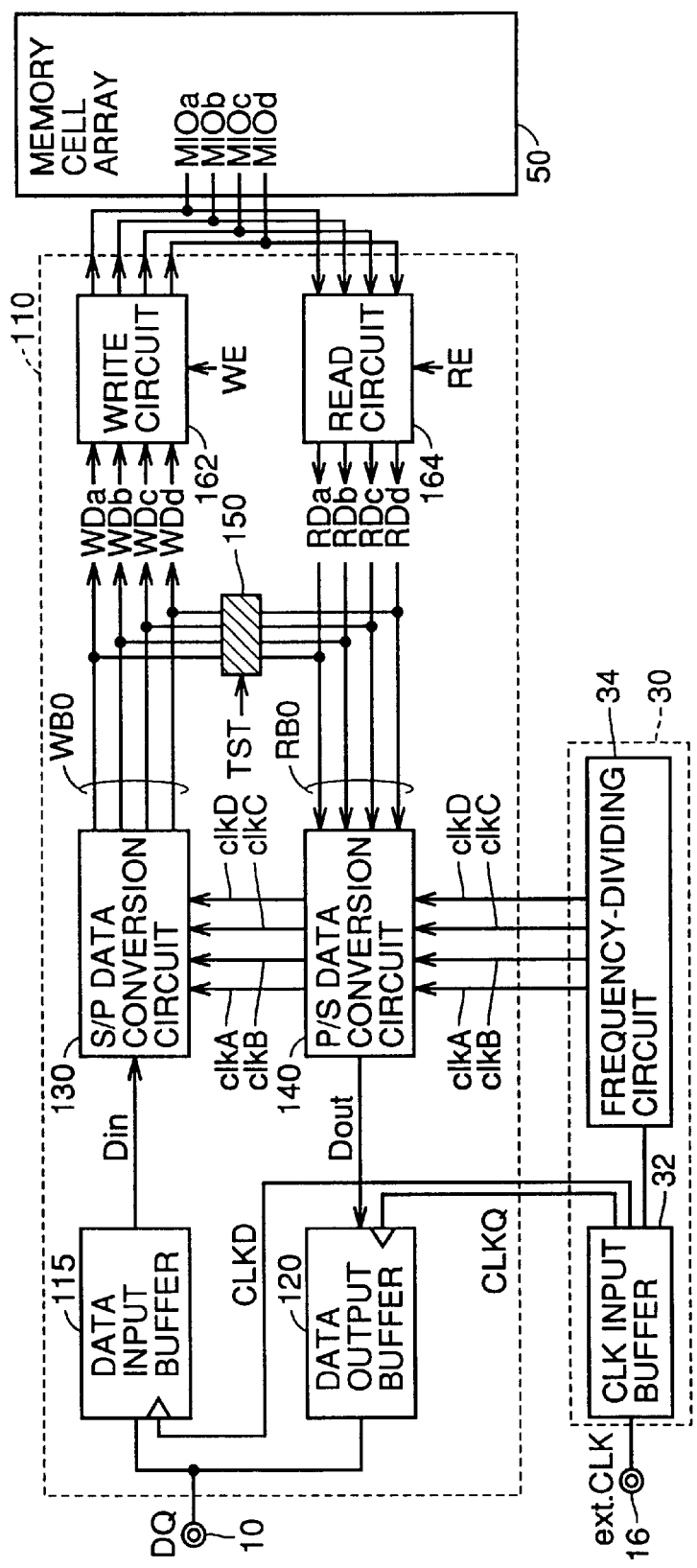
FIG. 2 is a block diagram illustrating a structure of a data input/output circuit 110 according to the first embodiment.

FIG. 2 is a block diagram illustrating a structure of data input/output circuit 110 according to the first embodiment.

Referring to FIG. 2, data input/output circuit 110 inputs and outputs four consecutive data DQ via one-bit data terminal 10 synchronously with the rising and falling edges of external clock signal ext.CLK supplied to clock terminal 16.

Data input/output circuit 110 operates synchronously with internal clock signals CLKD and CLKQ and internal frequency-divided clock signals clka to clkD generated by internal clock generating circuit 30.

Data input/output circuit 110 includes a data input buffer 115 which takes input data supplied to data terminal 10 in response to internal clock signal CLKD and outputs four consecutive data successively as data Din, an S/P data conversion circuit 130 which transmits four consecutive data Din respectively to four write data lines WDa to WDd synchronously with internal frequency-divided clock signals clkA to clkD, and a write circuit 162 which responds to activation of write control signal WE to write input data transmitted to write data lines WDa to WDd into memory cell array 50. Write circuit 162 transmits input data to memory cell data lines MIOa to MIOd so as to supply and receive data between memory cell data lines MIOa to MIOd and a memory cell selected in response to an address signal.

Data input/output circuit 110 thus makes by S/P data conversion circuit 130 serial-parallel conversion of four consecutive data supplied from the data terminal and writes by write circuit 162 four data transmitted by write data lines WDa to WDd into the memory cell array, so as to enhance the data input/output frequency.

Data input/output circuit 110 further includes a read circuit 164 which transmits four parallel data read from memory cell array 50 via memory cell data lines MIOa to MIOd respectively to read data lines RDa to RDd, a P/S data conversion circuit 140 which outputs four parallel read data successively as output data Dout in response to internal frequency divided clock signals clkA to clkD, and a data output buffer 120 which outputs output data Dout to data terminal 10 synchronously with internal clock signal CLKQ.

In data output operation, data input/output circuit 110 simultaneously reads four data in parallel from memory cell array 50, and outputs them to data terminal 10 which is one-bit data pin after execution of parallel-serial conversion thereof by P/S data conversion circuit 140.

Data input/output circuit 110 has S/P data conversion circuit 130 and P/S data conversion circuit 140 and is accordingly capable of doing serial-parallel conversion of data, as done by data input/output circuit 100.

Figure 3:
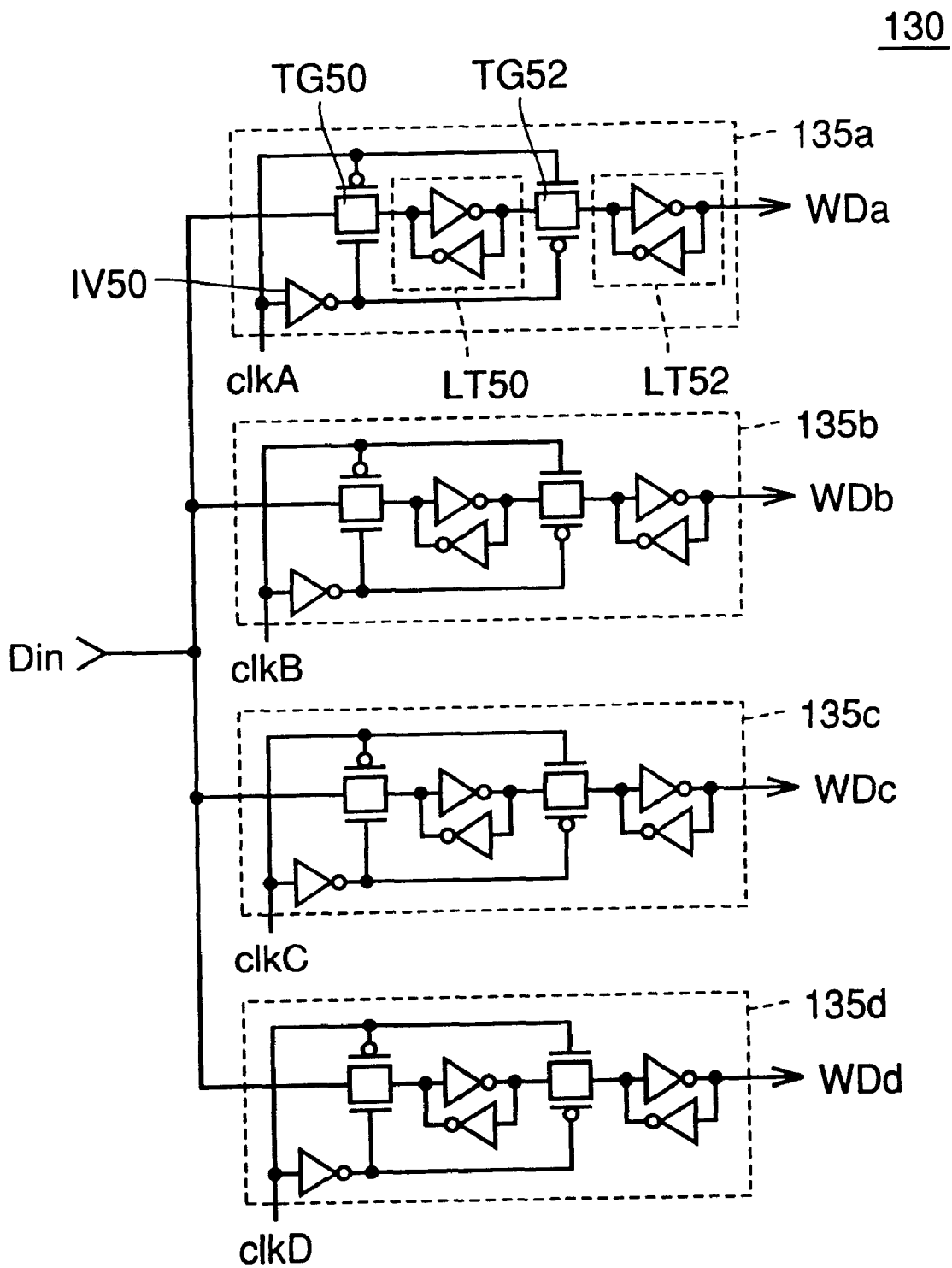
FIG. 3 is a circuit diagram illustrating a structure of an S/P data conversion circuit 130.

FIG. 3 is a circuit diagram illustrating a structure of S/P data conversion circuit 130.

Referring to FIG. 3, S/P data conversion circuit 130 includes register circuits 135a to 135d respectively associated with write data lines WDa to WDd. Register circuits 135a to 135d transmit input data Din to associated write data lines synchronously with internal frequency-divided clock signals clkA to clkD respectively.

Register circuit 135a includes a transfer gate TG50, a latch circuit LT50, a transfer gate TG52 and a latch circuit LT52 connected in series between a node to which input data Din is transmitted and write data line WDa. Transfer gates TG50 and TG52 operate in response to internal frequency-divided clock signal clkA and to an inverted signal of clkA signal which is the output of an inverter IV50.

Accordingly, register circuit 135a outputs, data latched by latch circuit LT50 via transfer gate TG50 when internal frequency-divided clock signal clkA is in an inactive (L level) state, to write data line WDa in response to rising edge of internal frequency-divided clock signal clkA.

Register circuits 135b to 135d each have a structure similar to that described above, and thus transmit data taken by a latch circuit to an associated one of write data lines WDb to WDd in response to activation of an associated internal frequency-divided clock signal.

By successively activating internal frequency-divided clock signals cLkA to clkD each at rising timing of internal clock signal CLKD which is an operation synchronous signal of the data input buffer, four serial data taken into the data input buffer can be supplied as parallel data to write data lines WDa to WDd. In the description below, write data lines WDa to WDd are generally referred to as write data line WB0 as required. Similarly, read data lines RDa to RDd are generally referred to as read data line RB0 as required.

Figure 4:
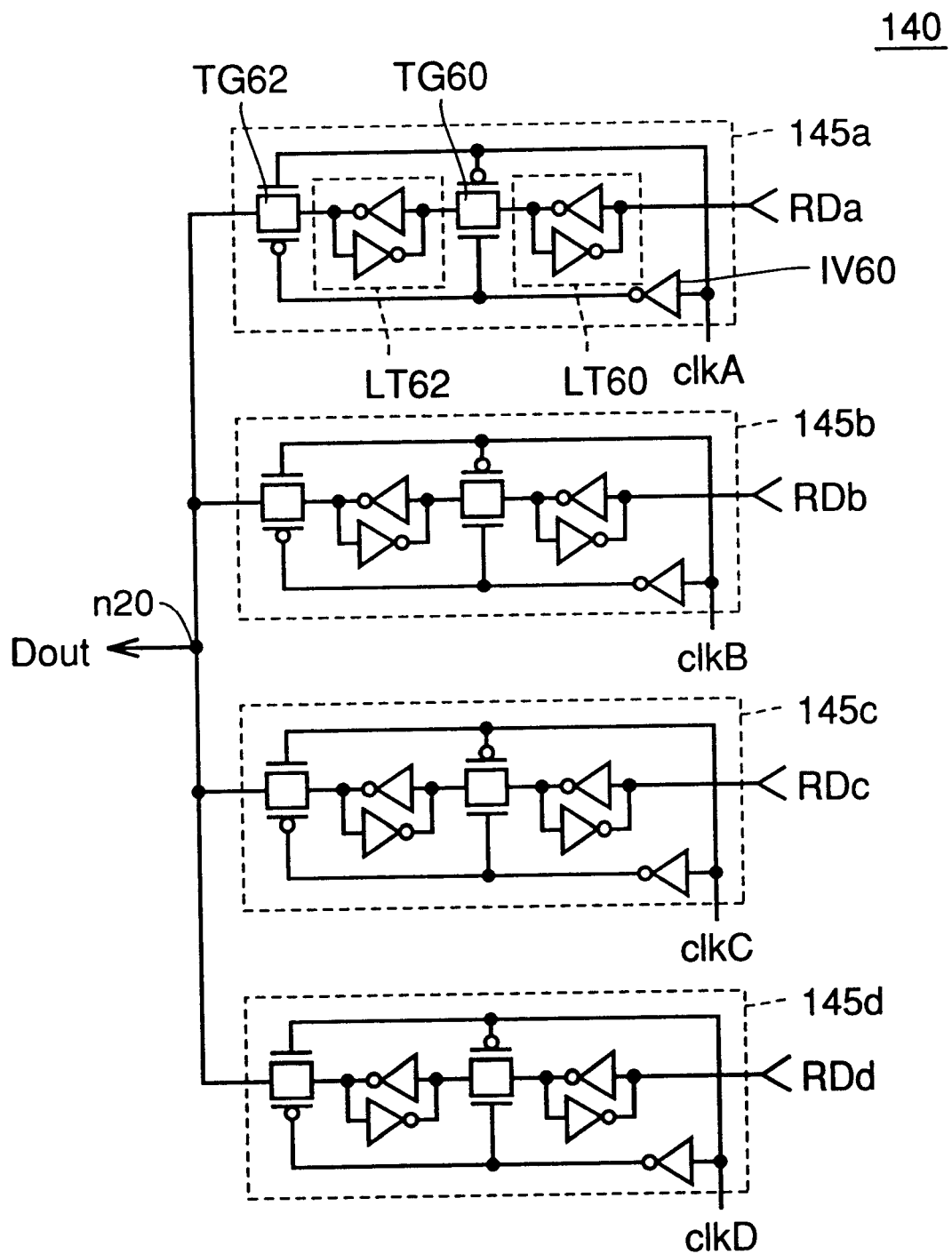
FIG. 4 is a circuit diagram illustrating a structure of a P/S data conversion circuit 140.

FIG. 4 is a circuit diagram illustrating a structure of P/S data conversion circuit 140.

Referring to FIG. 4, P/S data conversion circuit 140 includes register circuits 145a to 145d associated respectively with read data lines RDa to RDd.

Register circuit 145a includes a latch circuit LT60, a transfer gate TG60, a latch circuit LT62 and a transfer gate TG62 connected in series between read data line RDa and a node n20 from which input data Dout is output. Transfer gates TG60 and TG62 operate in response to internal frequency-divided clock signal clkA and an inverted signal of clkA signal which is an output of an inverter IV60.

Accordingly, register circuit 145a outputs, data latched by latch circuit LT62 via transfer gate TG60 when internal frequency-divided clock signal clkA is in the inactive (L level) state, to node n20 in response to rising edge of internal frequency-divided clock signal clkA.

Register circuits 145b to 145d each have a structure similar to that described above and thus transmit data taken by a latch circuit successively to node n20 in response to activation of an associated internal frequency-divided clock signal.

By such a structure, four-bit parallel data read in parallel from the memory cell array and transmitted respectively by read data lines RDa to RDd are transmitted to node n20 as four serial output data Dout.

Figure 15:
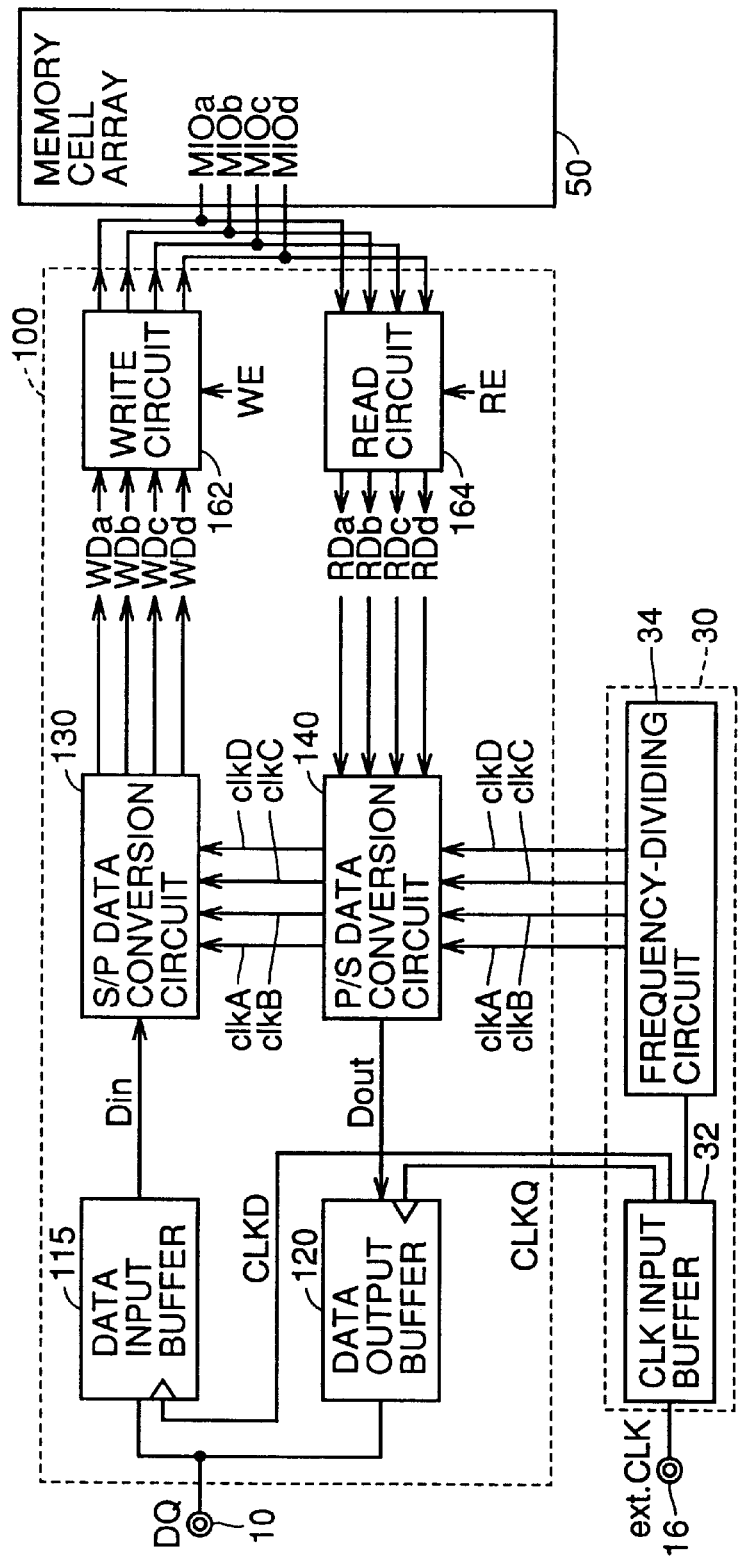
FIG. 15 is a block diagram illustrating a structure of a data input/output circuit 100 of a semiconductor memory device that has data input frequency four times as high as internal operating frequency.
Figure 16:
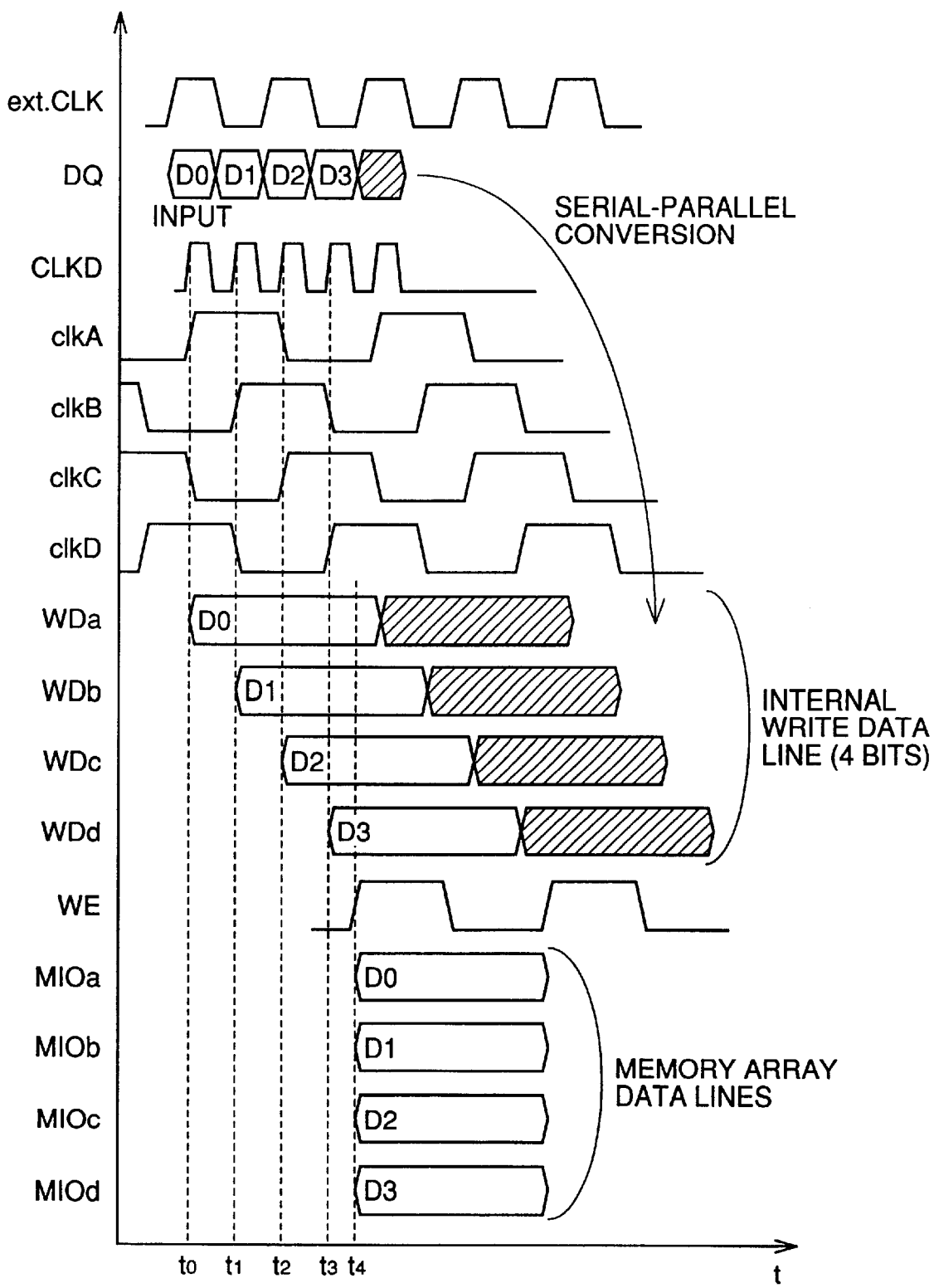
FIG. 16 is a timing chart illustrating a data input operation by data input/output circuit 100.
Figure 17:
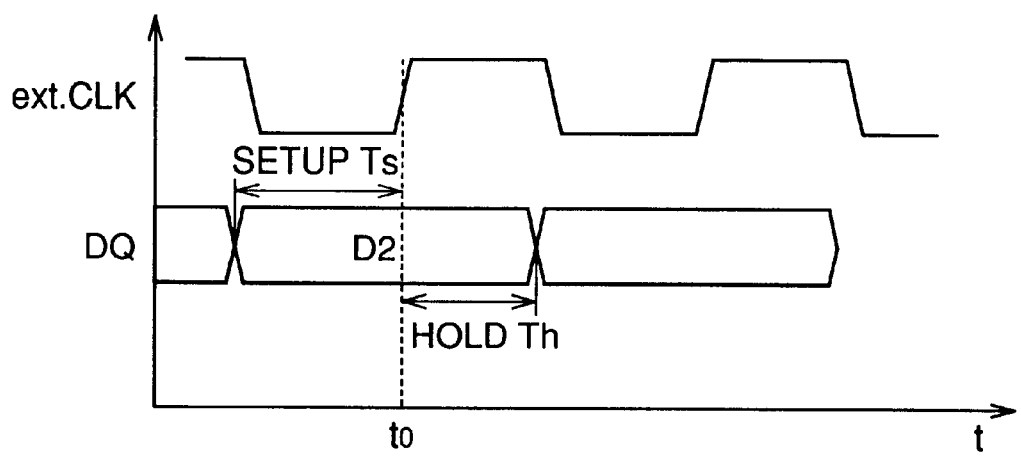
FIG. 17 is a timing chart illustrating data input timing when data input/output frequency is equal to internal operation frequency.
Figure 18:
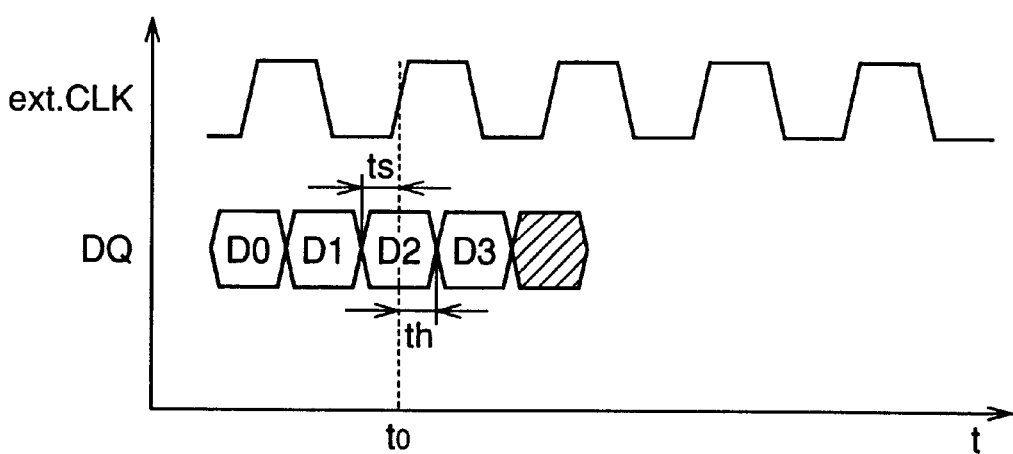
FIG. 18 is a timing chart illustrating data input timing when data input frequency is four times as high as internal operating frequency.

Data input/output circuit 110 includes, in addition to the structure of input/output circuit 100 as described in conjunction with FIG. 15, an input/output test circuit 150 which is connected between write data lines WDa to WDd and read data lines RDa to RDd and operates in response to input/output circuit test signal TST.

Input/output test circuit 150 is provided to each data terminal for confirming whether or not the data input/output operation is properly carried out in an associated data input/output circuit.

Data input/output circuit 110 in the first embodiment aims to execute an efficient operation test thereof the by input/output test circuit 150.

Figure 5:
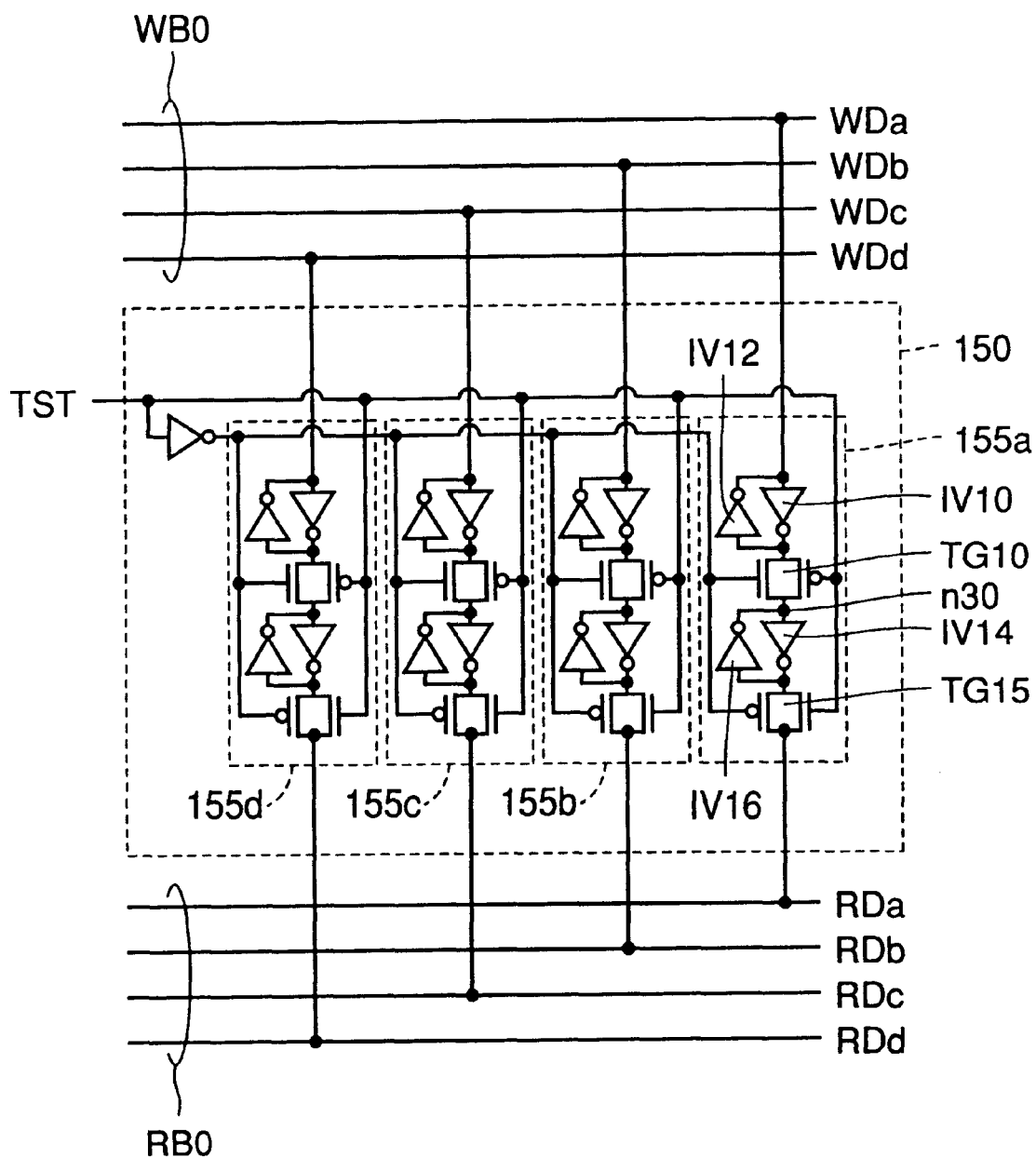
FIG. 5 is circuit diagram illustrating a structure of an input/output test circuit 150.

FIG. 5 is a circuit diagram illustrating a structure of input/output test circuit 150.

Referring to FIG. 5, input/output test circuit 150 includes data transmit circuits 155a to 155d connected respectively between write data lines WDa to WDd and read data lines RDa to RDd. Data transmit circuits 155a to 155d respond to input/output circuit test signal TST to transmit data on write data lines WDa to WDd respectively to read data lines RDa to RDd.

Data transmit circuit 155a includes an inverter IV10 and a transfer gate TG10 connected between write data line WDa and a node n30 and includes an inverter IV14 and a transfer gate TG15 connected in series between node n30 and read data line RDa.

Data transmit circuit 155a further includes an inverter IV12 which is provided to constitute a latch circuit together with inverter IV10 and includes an inverter IV16 which is provided to constitute a latch circuit together with inverter IV14.

By such a structure, when input/output circuit test signal TST is in the inactive (L level) state, data on write data line WDa is transmitted to node n30 to be latched by inverters IV14 and IV16. However, transfer gate TG15 is in OFF state in this condition so that the data on write data line WDa is not directly transmitted to read data line RDa. Therefore, data read from the memory cell array can be transmitted by read data line RDa to P/S conversion circuit 140 so as to perform a normal reading operation.

If input/output circuit test signal TST is activated (at H level), transfer gate TG15 attains ON state to transmit data latched by node n30 to read data line RDa. Accordingly, when input/output circuit test signal TST is in the active state, data transmitted by write data line WDa can be read onto read data line RDa.

Data transmit circuits 155b to 155d each have a structure similar to that described above and transfer data transmitted to write data lines WDb to WDd respectively to associated read data lines RDb to RDd in response to activation of input/output circuit test signal TST.

As clearly understood from the following description, access to the memory cell is unnecessary in the test operation of the input/output circuit in this embodiment. Therefore, if input/output circuit test signal TST is activated, there is no need to consider the case in which read data from the memory cell is transmitted by read data lines RDa to RDd. However, in order to ensure certainty of the operation, it is possible to separate read circuit 164 from read data lines RDa to RDd when input/output circuit test signal TST is activated.

Figure 6:
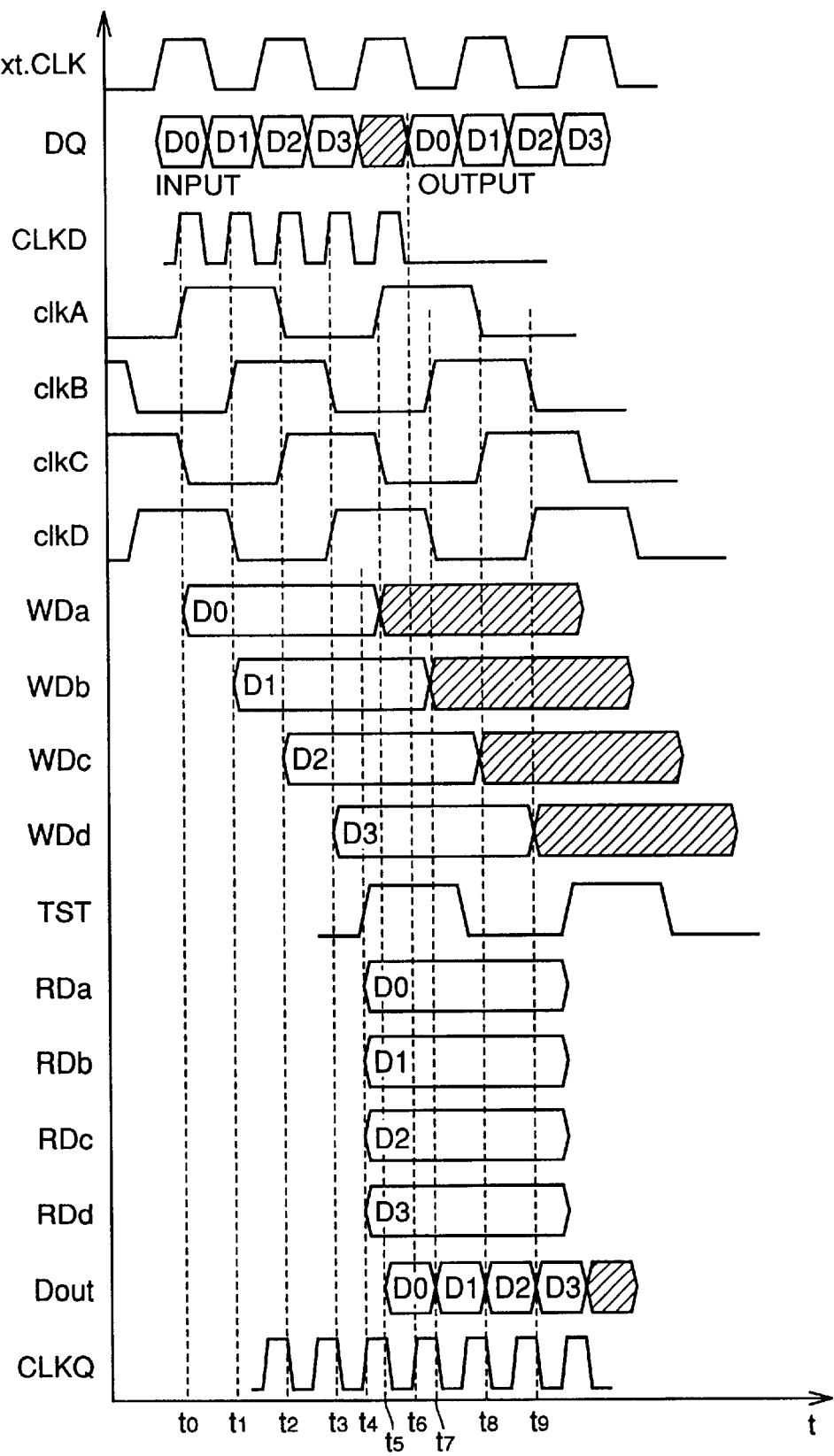
FIG. 6 is a timing chart illustrating a test operation by input/output test circuit 150.

FIG. 6 is a timing chart illustrating a test operation by input/output test circuit 150.

Referring to FIG. 6, four consecutive data D0 to D3 are input from the data terminal in response to rising and falling edges of external clock signal ext.CLK. Input data D0 to D3 are transmitted in parallel to write data lines WDa to WDd by the data input buffer and the S/P conversion circuit in response to internal clock signal CLKD and internal frequency divided clock signals clkA to clkD.

At time t0 to time t3 which are each activation timing of internal clock signal CLKD, data D0 to D3 are respectively transmitted to write data lines WDa to WDd.

After time t3 at which transmission of input data to write data lines WDa to WDd is completed, at time t4, input/output circuit test signal TST is activated (H level). In response to this, data on write data lines WDa to WDd are respectively transmitted to read data lines RDa to RDd by input/output test circuit 150. Four data D0 to D3 transmitted to read data lines RDa to RDd are output one by one as serial data Dout by P/S data conversion circuit 140 and accordingly transmitted to the data terminal.

Specifically, P/S data conversion circuit 140 outputs data D0 at time t5. Output data D0 is output to data terminal 10 via data output buffer 120 at time t6 in response to activation of internal clock signal CLKQ.

Similarly, at time t7 to time t9 respectively, P/S data conversion circuit 140 outputs data D1 to D3 respectively. Output data D1 to D3 are read from data terminal 10 successively in synchronization with internal clock signal CLKQ.

In this way, input/output test circuit 150 can transmit data D0 to D3 which are input from the data terminal and converted to parallel data by S/P data conversion circuit 130 to the read data lines without input/output of the data to and from the memory cells and then the data can be read again from the data terminal.

Accordingly, whether or not a defect occurs solely in data input/output circuit 110 in data input/output operation can simply be tested.

This test is conducted without writing data into a memory cell, so that input of an address is unnecessary in the test operation. As a result, the data input/output circuit can be tested without using any expensive memory tester. Further, data input/output is tested without performing data writing operation into a memory cell, so that the test time can be shortened.

In semiconductor memory device 1000 in the first embodiment of the invention, an operation test for enabling detection of a defect in only the data input/output circuit can be executed with low-cost in a short period of time.

Second Embodiment

In the first embodiment, the input/output test circuit is provided to each data terminal so as to independently execute the operation test of the input/output circuit associated with each data terminal. In the second embodiment, however, a plurality of data terminals are simultaneously used to more efficiently make the operation test of the data input/output circuit.

Figure 7:
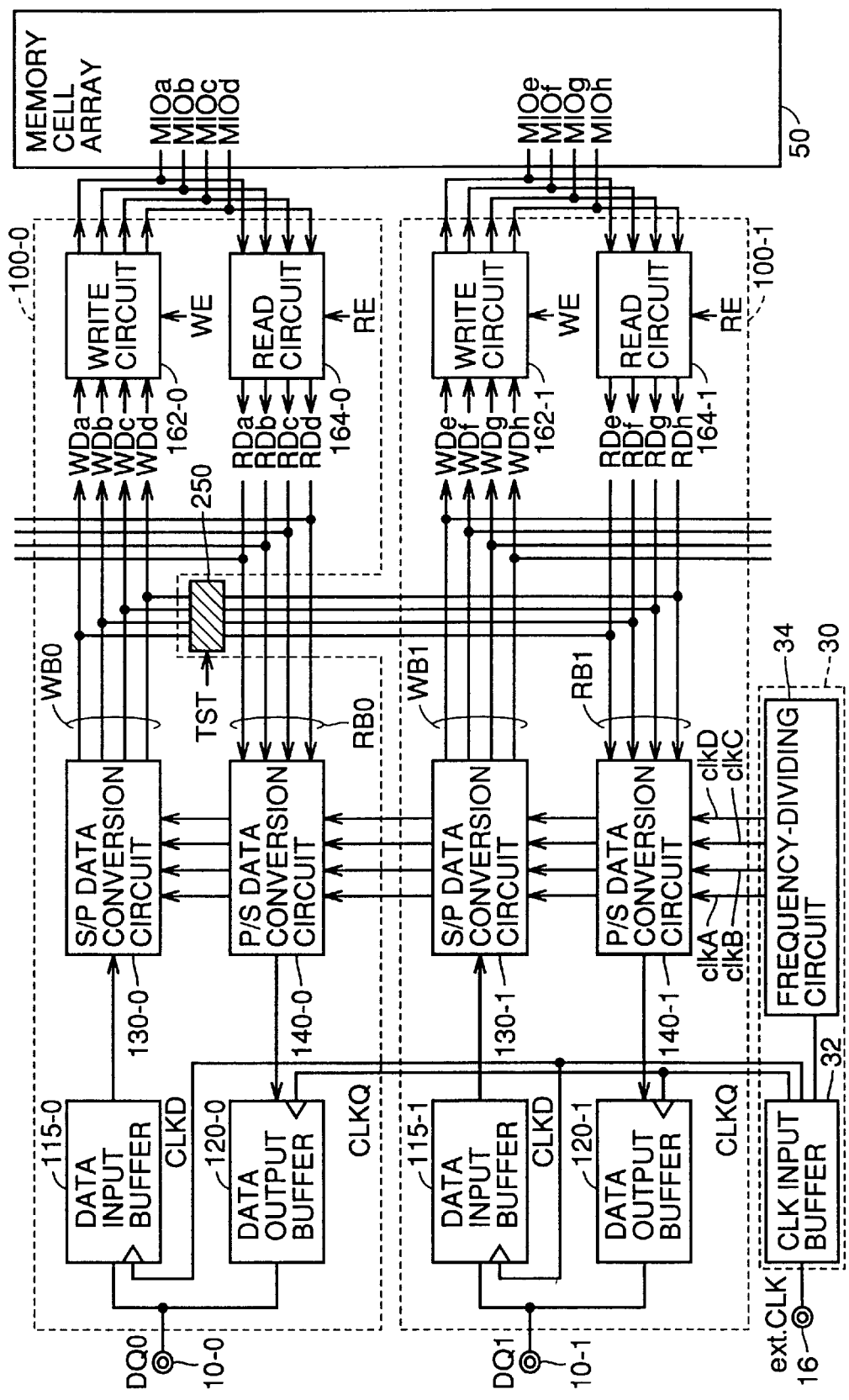
FIG. 7 is a block diagram illustrating an arrangement of an input/output test circuit 250 according to a second embodiment.

FIG. 7 is a block diagram illustrating an arrangement of an input/output test circuit 250 according to the second embodiment.

In the second embodiment, two data terminals are used as one set to perform a test of an input/output circuit. A test operation is now described below as one example in conjunction with FIG. 7 which is conducted by using data terminals 10-0 and 10-1 as one set.

Referring to FIG. 7, data input/output circuits 100-0 and 100-1 are provided respectively to be associated with data terminals 10-0 and 10-1. Data input/output circuit 100-0 is not configured to have a test circuit, and accordingly has the same structure as that of data input/output circuit 100 illustrated in FIG. 15.

Data input/output circuit 100-0 supplies and receives data to and from a memory cell array 50 via memory cell data lines MIOa to MIOd. Input/output circuit 100-0 includes write data lines WDa to WDd and read data lines RDa to RDd for transmitting four parallel data.

Data input/output circuit 100-1 supplies and receives data to and from memory cell array 50 via memory cell data lines MIOe to MIOh. Data input/output circuit 100-1 includes write data lines WDe to WDh and read data lines RDe to RDh for transmitting four parallel data. In the following description, write data lines WDe to WDh in input/output circuit 100-1 are generally referred to as write data line WB1 as required. Similarly, read data lines RDe to RDh are generally referred to as read data line RB1 as required.

In the second embodiment, input/output test circuit 250 is placed between write data line WB0 associated with data terminal 10-0 and read data line RB1 associated with data terminal 10-1.

Input/output test circuit 250 has a structure similar to that of input/output test circuit 150 illustrated in FIG. 5, and transfers data transmitted by write data line WB0 to read data line RB1 associated with data terminal 10-1 in response to activation of input/output circuit test signal TST.

In this case, when an input/output test operation is carried out, data terminal 10-0 is used as a terminal dedicated to input and data which is input from data terminal 10-0 is output from data terminal 10-1 via read data line RB1 without passing through a memory cell.

By such a structure, an operation test of the data input/output circuit can be executed by input/output test circuit 250 using consecutive data, the number thereof being at least the number of data, i.e. bit number which can be processed at a time by an S/P data conversion circuit (4 bits in the example of FIG. 7).

Although the structure illustrated in FIG. 7 is configured to have the input/output test circuit located between two adjacent data terminals, the use of the present invention is not limited to such a structure. Specifically, even if any similar input/output test circuit is placed between two arbitrary data terminals, the present invention achieves the similar effect.

Figure 8:
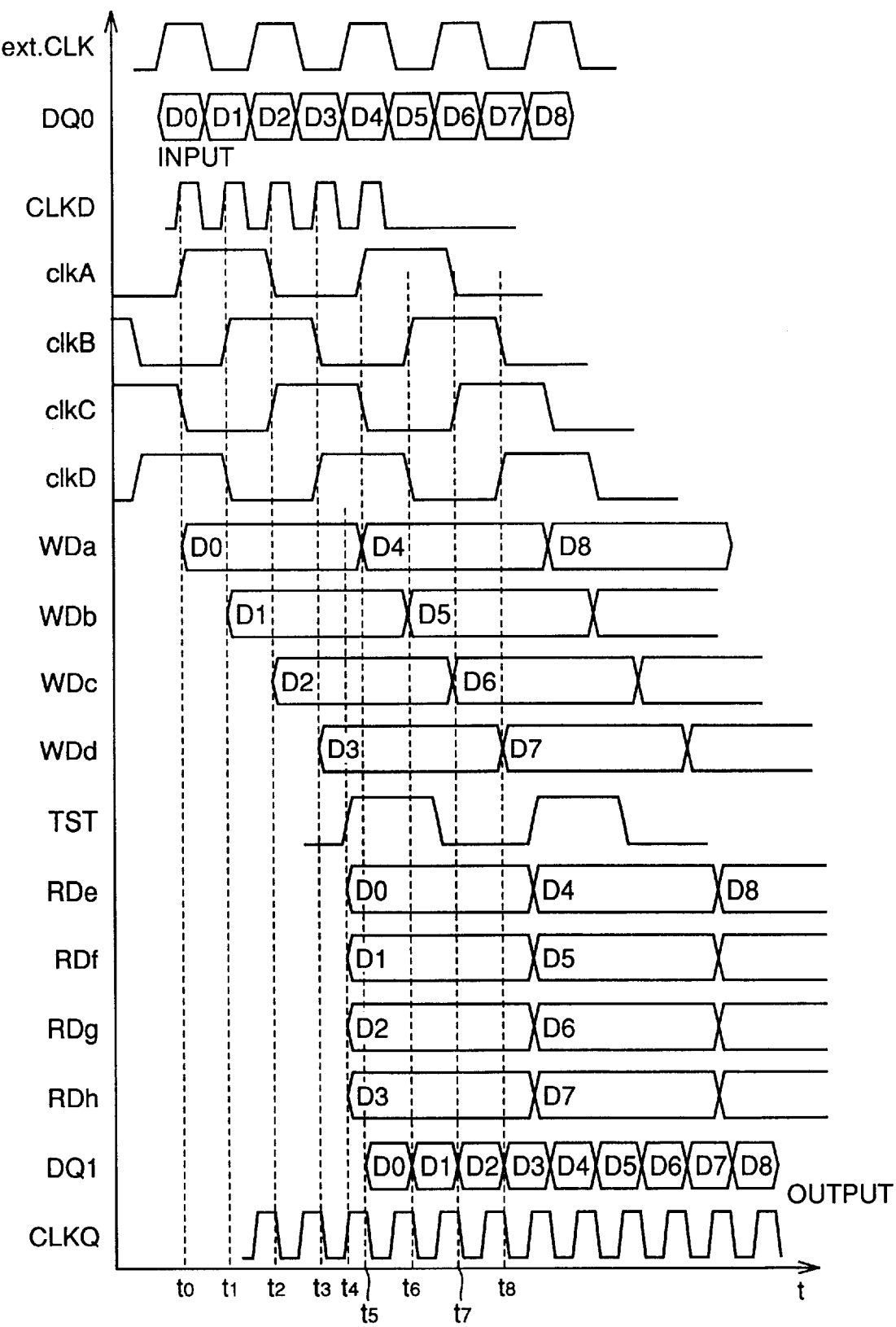
FIG. 8 is a timing chart illustrating a test operation by input/output test circuit 250.

FIG. 8 is a timing chart illustrating a test operation conducted by input/output test circuit 250.

Referring to FIG. 8, from time t0, input data D0 to D8 used for test are supplied as input DQ0 to data terminal 10-0. First at time t0 to time t3, input data D0 to D3 are transmitted to write data lines WDa to WDd in response to activation of internal frequency-divided clock signals clkA to clkD.

At time t4 between time t3 at which 4-bit data which can be treated by the P/S data conversion circuit at a time have been processed and time t5 at which internal frequency-divided clock signal clkA is activated next, input/output circuit test signal TST is activated, data on write data lines WDa to WDd are transmitted respectively to read data lines RDe to RDh associated with data terminal 10-1, and data corresponding to data D0 to D3 supplied to data terminal 10-0 are output as output DQ1 of data terminal 10-1 in response to activation timing of internal clock signal CLKQ from time t5 to time t8.

On the other hand, at time t5, internal frequency-divided clock signal clkA is activated again and data D4 input to data terminal 10-0 is transmitted to write data line WDa. From time t6 to time t8, data D5 to D7 are also transmitted to write data lines WDb to WDd respectively in response to activation of internal frequency-divided clock signals clkB to clkD.

At time t8 when transmission of data D4 to D7 to write data lines WDa to WDd is completed, input/output circuit test signal TST is in the inactive state (L level) so that at this time data D4 to D7 are held by a latch circuit within input/output test circuit 250. The data are not transferred to read data lines RDe to RDh.

After time t8, input/output circuit test signal TST is activated (H level) again to transmit data D4 to D7 to read data lines RDe to RDh in data input/output circuit 100-1 and output them from data terminal 10-1. In this way, in the input/output circuit test operation in the second embodiment, two data terminals are associated with each other such that one is dedicated to data input and the other is dedicated to data output. Consequently, it is possible to test the input/output operation of at least the number of consecutive bits processible by S/P data conversion circuit 130.

By executing an input test of such consecutive multi-bit data, an effective analysis is possible of defect or the like due to distortion of signal waveform generated after establishing a memory system which is configured using a plurality of semiconductor memory devices (also hereinafter referred to as memory device).

Figure 9:
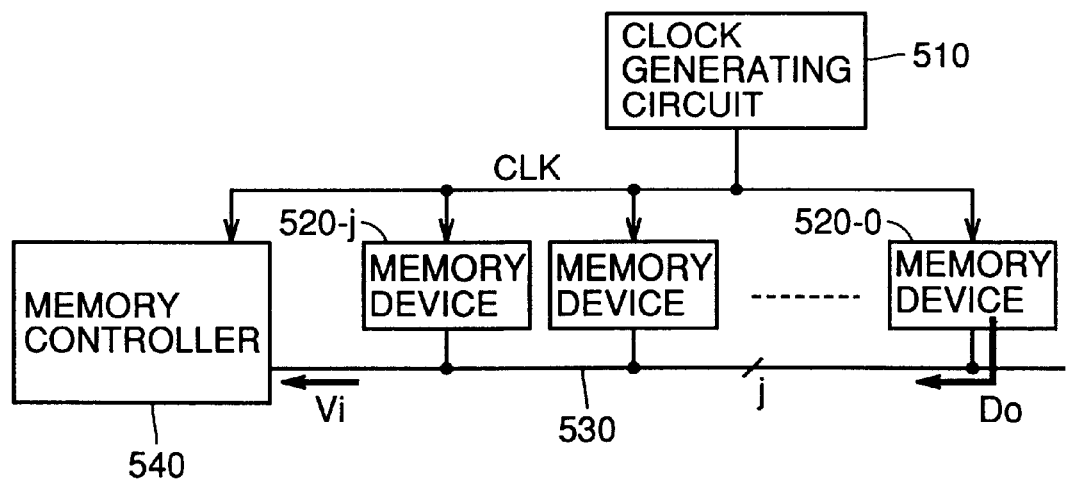
FIG. 9 is a schematic block diagram illustrating an entire structure of a memory system 2000 composed of a plurality of memory devices.

FIG. 9 is a schematic block diagram illustrating a structure of a memory system 2000 configured of a plurality of memory devices.

Referring to FIG. 9, memory system 2000 includes a clock generating circuit 510 which generates clock signal CLK for synchronously operating a plurality of memory devices, a plurality of memory devices 520-0 to 520-j which operate in synchronization with each other based on clock signal CLK, a memory controller 540 which controls the entire memory system, and a data bus 530 for transmitting data between each memory device and memory controller 540.

In general, with increase in frequency, greater influence of reflection occurring at a branch point is exerted on a transmission signal in the system, resulting in an increased distortion of signal waveform. Specifically, in memory system 2000, if the frequency of clock signal CLK is increased and the frequency of a data signal transmitted to data bus 530 is accordingly increased, the influence of reflection occurring at a branch point becomes greater so that the signal waveform at input points of memory devices 520-0 to 520-j is distorted.

As a result, it becomes difficult to correctly transmit data between each memory device and the memory controller and thus defect in data input could occur. By executing the operation test of the input/output circuit in the second embodiment according to which the frequency of consecutive test input data is increased, the relation between the data input/output frequency and defect due to distortion of the signal can be known in advance.

In this way, regarding memory system 2000, test is possible to determine to which extent the frequency of data bus 530 can be increased after completing the system. Further, test of the input/output circuit can be performed for each memory module, i.e. for each of memory devices 520-0 to 520-j, and thus evaluation is possible of the maximum number of installed modules at the maximum operating frequency.

When the operation test of the input/output circuit is conducted in the second embodiment, dependency on pulse width can also be evaluated by changing the pulse width of consecutive data.

Figure 10:
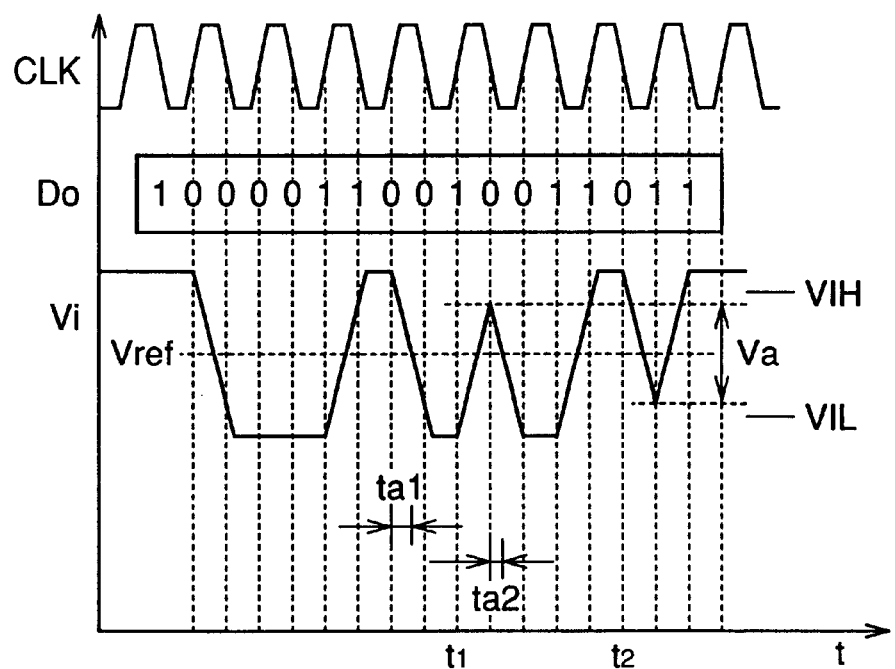
FIG. 10 a waveform chart illustrating occurrence of defect depending on pulse width of a data signal.

FIG. 10 is a waveform chart illustrating occurrence of defect depending on pulse width of a data signal.

Referring to FIG. 10, data D0 represents a logic value of a data signal to be output from memory device 520-0 in FIG. 9. Vi represents a voltage level at a data input node of memory controller 540.

The state in FIG. 10 illustrates that a large number of memory devices are connected to data bus 530 and thus load capacitance of the data bus interconnection line increases to make the rise/fall time longer regarding the signal waveform of the data bus. As shown in FIG. 10, the rise/fall time of voltage Vi corresponding to change in output data D0 of the memory device is longer than the frequency of clock signal CLK.

When H level data ("1") with short pulse is to be output at time t1, voltage Vi start changing from time t1. However, before voltage Vi reaches voltage VIH recognized as H level, the next data output (L level "0") is started so that Vi returns to L level again without attaining voltage VIH. As a result, the H level data of D0 is not appropriately transmitted resulting in system defect.

A similar phenomenon occurs when L level data ("0") with short pulse is output at time t2. In this case, voltage Vi similarly starts decreasing from time t2, however, the next data output (H level) is started before the voltage attains voltage VIL recognized as L level, so that the L level data of D0 is not recognized by memory controller 540 and the voltage level of Vi returns again to H level.

This phenomenon further causes variation of clock access depending on the pulse width of the data signal. The clock access is defined as a time period from the activation timing of a clock signal functioning as output trigger of data to the time at which voltage Vi reaches reference voltage Vref. In other words, if data with wide pulse width is transmitted, clock access corresponds to ta1 shown in FIG. 10. On the other hand, if data with short pulse width is transmitted, the signal starts changing when the amplitude of the memory bus does not sufficiently change, so that an access is made faster than the case in which the pulse width is greater. As a result, clock access ta2 required when data with the minimum pulse width is transmitted is shorter than clock access ta1 required when data with a greater width is transmitted. Skew of access thus occurs depending on the width of output data to decrease timing margin of input in the memory controller portion and to cause system defect.

By the operation test of the data input/output circuit in the second embodiment, such defect can effectively detected. By changing the pulse width of test data which are consecutively input, it is possible to decrease the margin of rise/fail time of the memory bus and to check whether access skew depending on the pulse width occurs or not.

Third Embodiment

According to the third embodiment, a plurality of data terminals are divided into groups, test data input to one group is output from a data terminal of another group in order to check whether or not data interference occurs between data terminals.

Figure 11:
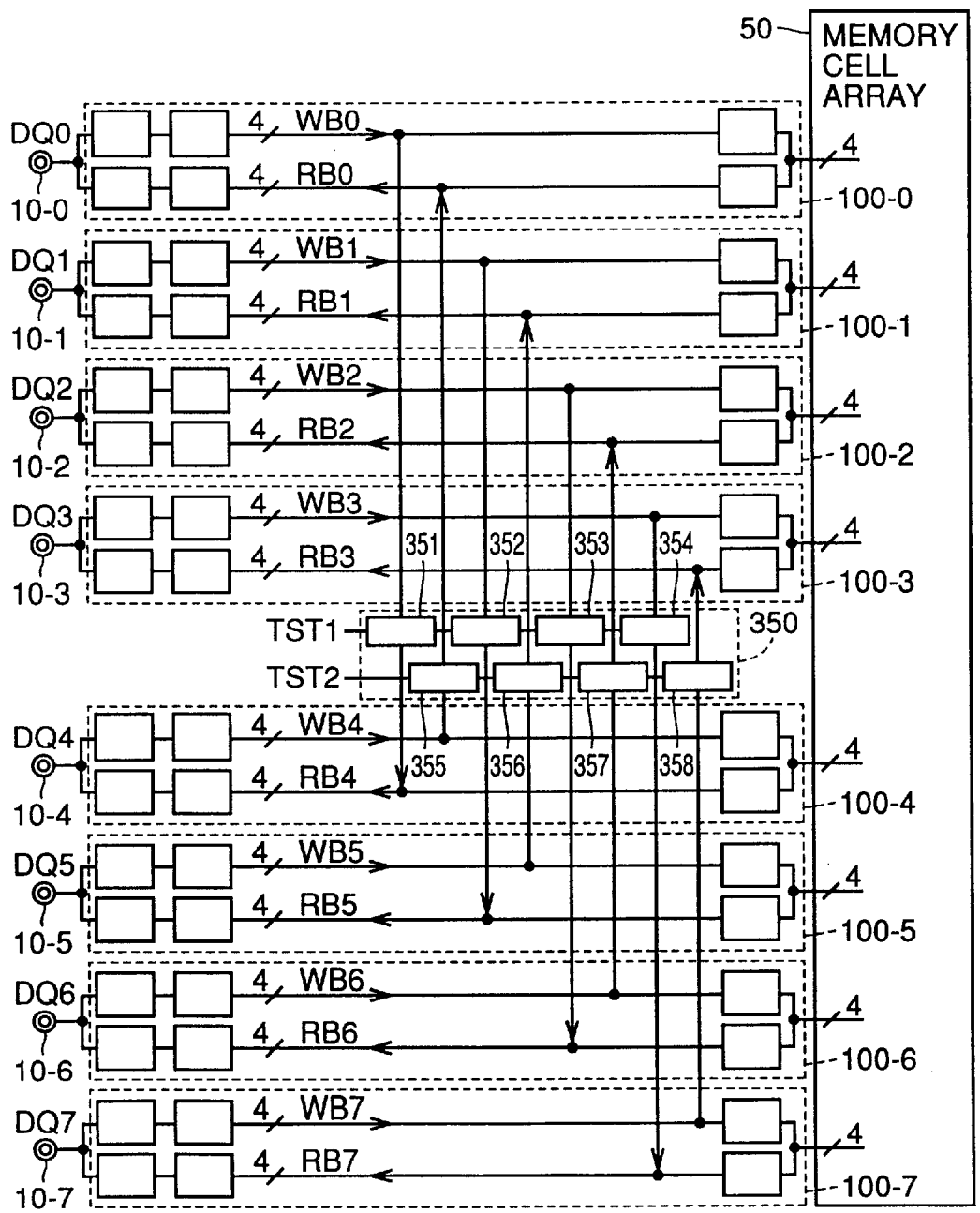
FIG. 11 is a block diagram illustrating an arrangement of an input/output test circuit 350 according to a third embodiment.

FIG. 11 is a block diagram illustrating an arrangement of an input/output test circuit 350 in the third embodiment.

Referring to FIG. 11, a semiconductor memory device in the third embodiment of the invention includes eight data terminals 10-0 to 10-7 as one example. Data input/output circuits 100-0 to 100-7 are provided to be associated with respective data terminals 10-0 to 10-7. The structure of each of data input/output circuits 100-0 to 100-7 is similar to that of data input/output circuit 100 illustrated in the second embodiment and thus description thereof is not repeated here.

The semiconductor memory device in the third embodiment further includes input/output test circuit 350. Input/output test circuit 350 includes switch circuits 351 to 354 operating in response to input/output circuit test signal TST1, and switch circuits 355 to 358 operating in response to input/output circuit test signal TST2.

Switch circuits 351 to 354 are placed between write data lines WB0 to WB3 associated respectively with data terminals 10-0 to 10-3 which constitute low-order bit pins and read data lines RB4 to RB7 associated respectively with data terminals 10-4 to 10-7 which constitute high-order bit pins.

Switch circuits 351 to 354 transfer data transmitted to write data lines WB0 to WB3 respectively to read data lines RB4 to RB7 in response to activation of input/output circuit test signal TST1.

Switch circuits 355 to 358 are placed between write data lines WB4 to WB7 associated respectively with data terminals 10-4 to 10-7 which constitute high-order bit pins and read data lines RB0 to RB3 respectively associated with data terminals 10-0 to 10-3 which constitute low-order bit pins.

Switch circuits 355 to 358 transfer data transmitted to write data lines WB4 to WB7 respectively to read data lines RB0 to RB3 in response to activation of input/output circuit test signal TST2.

The structure of switch circuits 351 to 358 each is similar to that of input/output test circuit 150 illustrated in FIG. 5 and description thereof is not repeated here.

In test operation, input/output circuit test signals TST1 and TST2 are controlled such that they are not activated simultaneously. When input/output circuit test signal TST1 is activated, low-order bit data terminals 10-0 to 10-3 are used as input-dedicated terminals so that test data can be read from high-order bit data terminals 10-4 to 10-7. On the other hand, when input/output circuit test signal TST2 is activated, high-order bit data terminals 10-4 to 10-7 are used as input-dedicated data terminals and test data is input thereto, and the result of test is output from low-order bit data terminals 10-0 to 10-3.

By such a structure, change in output data at data terminals on both sides of one data terminal of interest is observed so as to detect interference phenomenon observed in output data of the data terminal of interest exerted by other data terminal signals.

In the third embodiment, instead of dividing a group of data terminals into those associated with high-order bits and those associated with low-order bits as shown in FIG. 11, a group of data terminals can be divided into a plurality of groups each including the same number of terminals to place input/output test circuits between these groups. This alternative arrangement is not limited to a structure in which data terminals included in the same group are adjacent to each other as shown in FIG. 11.

In addition, by conducting the input/output circuit test operation in the third embodiment, even after a memory system having a semiconductor memory device installed therein is constructed, test of interference between signal lines on a system bus can be performed. Accordingly, test of interference between signal lines can effectively be carried out in development of high-performance system board and memory module.

Although the example shown in FIG. 11 includes eight data terminals, if there are a plurality of data terminals, a similar test can be conducted by providing a system which enables test data to be input and output between one data terminal and another one data terminal.

Fourth Embodiment

In the description of the first to the third embodiments above, the structure for testing the operation of the data input buffer and the S/P data conversion circuit is illustrated. However, even if both circuits normally operate, a problem could arise due to mismatched phases of a clock signal for data input and an operation control signal of a semiconductor memory device.

Figure 12:
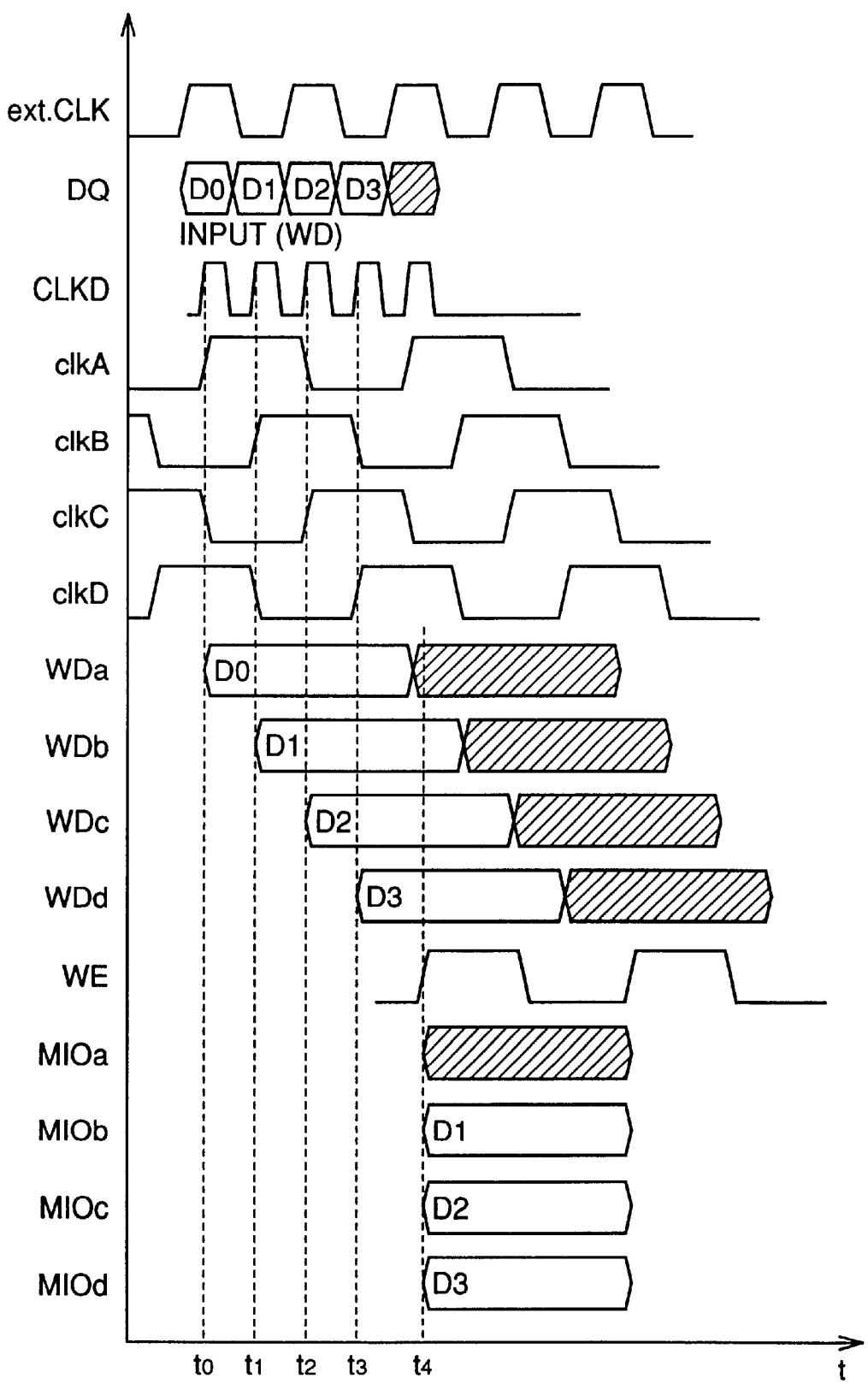
FIG. 12 is a timing chart illustrating a problem which arises due to mismatched phases of a clock signal for data input and an operation control signal of the semiconductor memory device.

FIG. 12 is a timing chart illustrating a problem which occurs when the phase of a clock signal for data input and the phase of an operation control signal of a semiconductor memory device are mismatched.

Referring to FIG. 12, from time t0 to time t3, four consecutive data D0 to D3 are taken into a data input buffer each at activation timing of internal clock signal CLKD, and the data are respectively transmitted to write data lines WDa to WDd by an S/P conversion circuit. The operations of the data input buffer and the S/P conversion circuit have normally been carried out at this time.

However, if the activation timing of write control signal WE, which is a timing signal used for writing data on the write data line into the memory cell array, delays behind time t4 at which the subsequent input data is transmitted to write data line WDa, data D0 which should originally be written into the memory cell array cannot be transmitted to memory cell data line MIOa.

The fourth embodiment aims to provide, in order to detect such an improper event by a test operation, a structure which enables external inspection of data converted to parallel data to be transmitted to the write data line and timing signal used for transferring these data to the memory cell array in the test operation.

Figure 13:
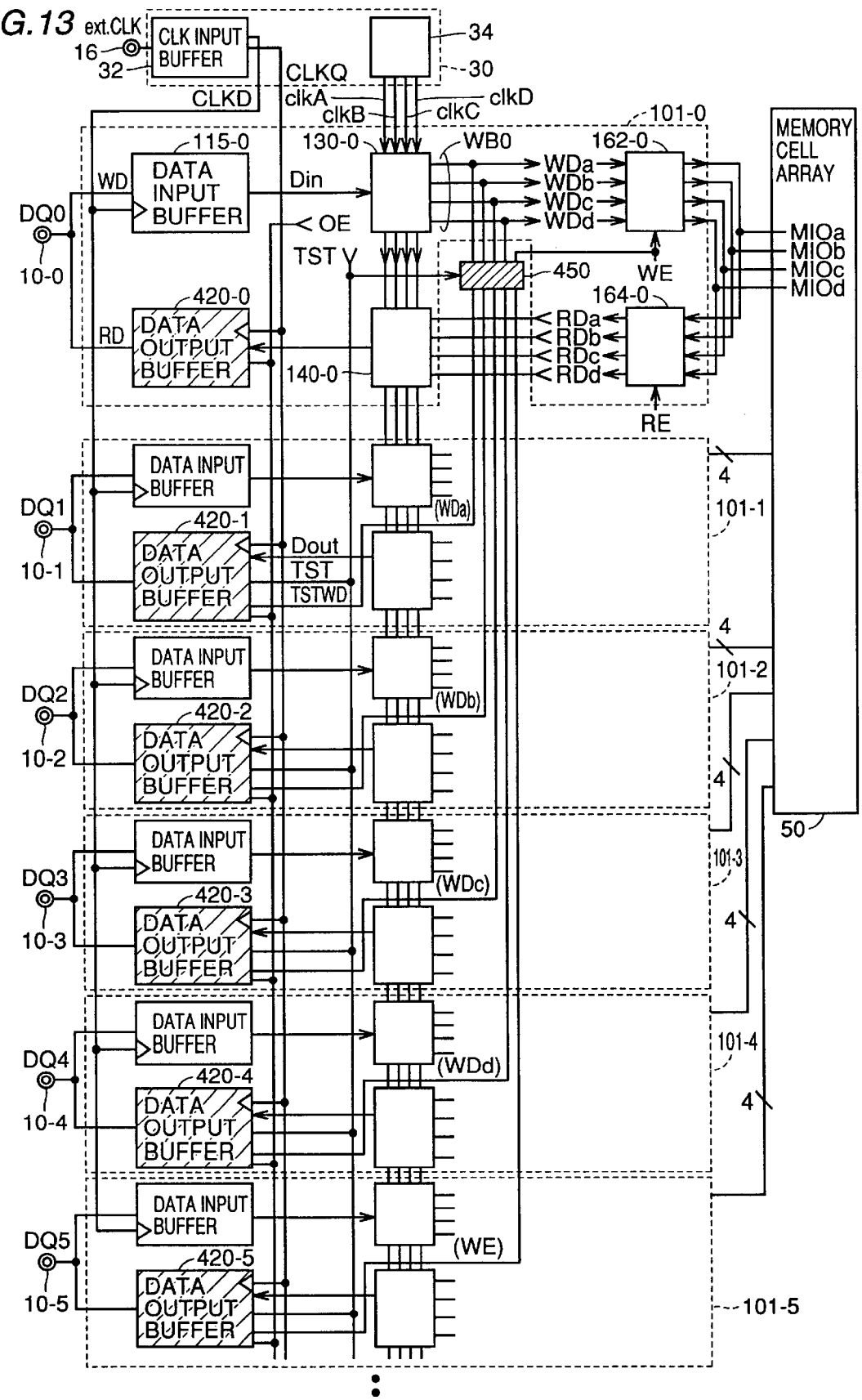
FIG. 13 is a block diagram illustrating an arrangement of an input/output test circuit 450 according to a fourth embodiment.

FIG. 13 is a block diagram illustrating an arrangement of an input/output test circuit 450 according to the fourth embodiment.

Referring to FIG. 13, data input/output circuits 101-0 to 101-5 are provided to be associated with data terminals 10-0 to 10-5 respectively.

A difference between data input/output circuits 101-0 to 101-5 and data input/output circuit 100-0 described above is that the former includes a data output buffer 420 instead of data output buffer 120. Detailed description of the structure of data output buffer 420 is given later.

Input/output test circuit 450 in the fourth embodiment outputs via data input/output circuits 101-1 to 101-5 data transmitted by write data lines WDa to WDd in input/output circuit 101-0 and write control signal WE to data terminals 10-1 to 10-5.

Input/output test circuit 450 receives data on write data lines WDa to WDd and write control signal WE from data input/output circuit 101-0 to transfer the data on write data lines WDa to WDd to data output buffers 420-1 to 420-4 respectively and transmit write control signal WE to data output buffer 420-5.

Each data output buffer receives test data TSTWD transmitted from input/output test circuit 450 and output data Dout from an associated P/S conversion circuit to transmit output data RD to the data terminal in response to output enable signal OE and input/output circuit test signal TST.

Figure 14:
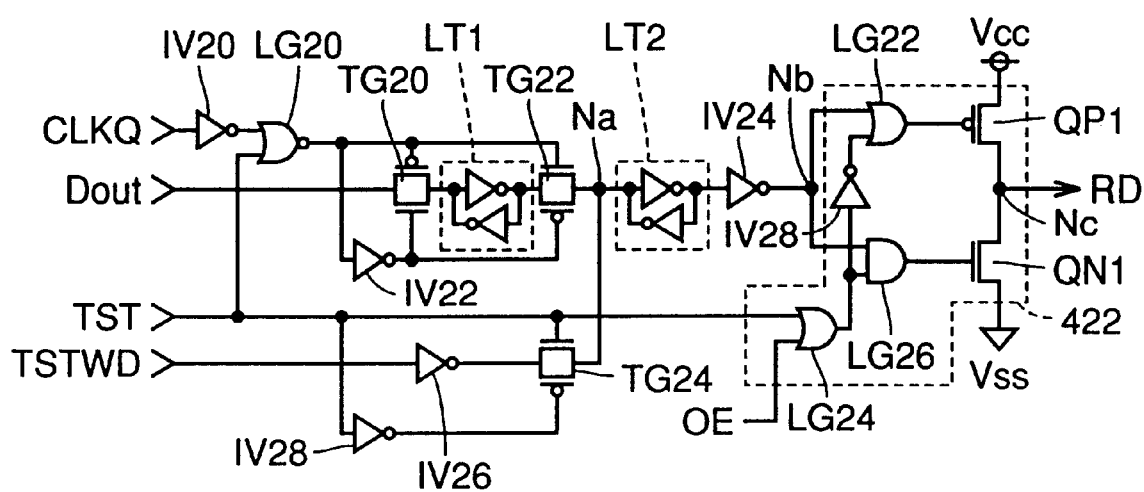
FIG. 14 is a circuit diagram illustrating a structure of a data output buffer 420.

FIG. 14 is a circuit diagram illustrating a structure of data output buffer 420.

Referring to FIG. 14, data output buffer 420 includes a transfer gate TG20, a latch circuit LT1 and a transfer gate TG22 connected between a node to which output data Dout from the P/S data conversion circuit is transmitted and a node Na. Data output buffer 420 further includes an inverter IV26 and a transfer gate TG24 connected between a node to which test data TSTWD is transmitted and node Na.

Transfer gate TG 24 attains ON state in response to activation of input/output circuit test signal TST to transmit an inverted signal of signal TSTWD to node Na. Transfer gates TG20 and TG22 are controlled by the output of a logic gate LG20. Logic gate LG20 operates according to the result of NOR operation of the inverted signal of clock signal CLKQ which is an output of inverter IV20 and input/output circuit test signal TST. Specifically, when input/output circuit test signal TST is activated (H level), the output of logic gate LG20 is maintained at L level and transfer gate TG22 is kept in OFF state. On the other hand, when input/output circuit test signal TST is inactivated (L level), transfer gates TG20 and TG22 attain ON and OFF states in the same phase as that of internal clock signal CLKQ.

Data output buffer 420 further includes a latch circuit LT2 and an inverter circuit IV24 connected between node Na and a node Nb. Accordingly, the voltage level of node Na is latched and one of the inverted state of output data Dout and test data TSTWD is transmitted to node Nb.

Data output buffer 420 further includes a voltage switching circuit 422 which supplies one of supply voltage Vcc (H level) and ground voltage Vss (L level) to a node Nc from which read data RD is output, according to output enable signal OE, input/output circuit test signal TST and the voltage level on node Nb.

Voltage switching circuit 422 includes a transistor QPl connected between node Nc and supply voltage Vcc (H level), a transistor QN1 connected between ground voltage Vss (L level) and node Nc, a logic gate LG24 receiving output enable signal OE and input/output circuit test signal TST as two inputs to output the result of OR operation, an inverter IV28 which inverts the output of logic gate LG24, a logic gate LG22 receiving the voltage level on node Nb and the output of inverter IV28 as two inputs to output the result of OR operation, and a logic gate LG26 receiving the output of logic gate LG24 and the voltage level on node Nb as two inputs to output the result of OR operation.

The output of logic gate LG22 is supplied to the gate of transistor QP1 and the output of logic gate LG26 is supplied to the gate of transistor QN1. The output of logic gate LG24 is set at H level when one of input/output circuit test signal TST and output enable signal OE is activated (H level), i.e. reading of data onto the data terminal becomes necessary. When the output of logic gate LG24 is set at H level, if the voltage level on node Nb is H level, the output of logic gate LG2G is set at H level to cause transistor QN1 to be turned on and accordingly read data RD is set at L level (Vss). In this state, if the voltage level on node Nb is L level, the outputs of logic gates LG22 and LG26 are both set at L level so that transistor QP1 is turned on to set read data RD at H level (Vcc).

In this way, data output buffer 420 outputs, if output enable signal OE is activated, read data RD according to the signal level of output data Dout and outputs, if the input/output circuit test signal TST is activated, read data RD according to the signal level of test data TSTWD.

In this structure thus configured, data output buffers 420-1 to 420-5 in respective data input/output circuits output, to the data terminals, read data RD according to the signal level of output data Dout transmitted from the memory cell array in the normal reading operation carried out by activating output enable signal OE. When input/output circuit test signal TST is activated, the data output buffers output read data RD according to the signal level of test data signal TSTWD transferred from test circuit 450.

Input/output test circuit 450 can accordingly output data signals respectively transmitted to write data lines WDa to WDd and write control signal WE via respective data output buffers 420-1 to 420-5 to associated data output terminals 10-1 to 10-5.

Consequently, in the test operation, it is possible to check unmatched timing of the clock signal for input data and the operation control signal in the semiconductor device. When any improper event occurs which concerns the input/output circuit, the cause of the event can correctly be found out.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device internally converting serial data supplied from and to any external unit into parallel data and executing reading and writing operations thereof, comprising:

a memory cell array having a plurality of memory cells arranged in rows and columns;

a data terminal for input and output of N data (N: natural number) transmitted in time series manner; and a data input/output circuit for reading and writing said N data from and into said memory cell array;

said data input/output circuit including:

N write data lines and N read data lines for transmitting said N data in parallel;

a first data conversion circuit which converts N serial data supplied from said data terminal into N parallel data to transmit the parallel data to said N write data lines respectively;

a second data conversion circuit which converts N parallel data transmitted by said N read data lines into N serial output data to be output from said data terminal;

a read and write circuit for supplying and receiving said N data between said N write data lines and said memory cell array and between said N read data lines and said memory cell array; and an input/output test circuit which transfers data transmitted by said N write data lines respectively to said N read data lines in an input/output test operation.

2. The semiconductor memory device according to claim 1, wherein said read and write circuit is inactivated in said input/output test operation.

3. The semiconductor memory device according to claim 1, wherein said input/output test circuit includes a plurality of data transmission circuits connected between said N read data lines and said N write data lines respectively, each of said data transmission circuits including:

a first latch circuit and a first transfer gate connected in series between an associated one of said write data lines and an internal node; and a second latch circuit and a second transfer gate connected in series between said internal node and an associated one of said read data lines, said second transfer gate attaining ON state in said input/output test operation, and said first transfer gate attaining ON and OFF states complementarily to said second transfer gate.

4. The semiconductor memory device according to claim 1, wherein reading and writing operations of said N data are performed in synchronization with rising and, falling edges of an external reference clock.

5. The semiconductor memory device according to claim 1, wherein reading and writing operations of said N data are performed at a frequency equal to or higher than twice a frequency of an external reference clock.

6. A semiconductor memory device internally converting serial date applied from and to any external unit into parallel data and executing reading and writing operations thereof, comprising:

a memory cell array having a plurality of memory cells arranged in rows and columns;

a plurality of data terminals each for independent input and output of N data (N: natural number) transmitted in time series manner; and a plurality of data input/output circuits arranged for said data terminals respectively, each for reading and writing said N data from and into said memory cell array;

said data input/output circuits each including:

N write data lines and N read data lines for transmitting said N data in parallel;

a first data conversion circuit which converts N serial data supplied from an associated one of said data terminals into N parallel data to transmit the parallel data to said N write data lines;

a second data conversion circuit which converts N parallel data transmitted by said N read data lines into N serial output data to be output from said associated data terminal; and a read and write circuit for supplying and receiving said N data between said N write data lines and said memory cell array and between said N read data lines and said memory cell array, said semiconductor memory device further comprising a plurality of first input/output test circuits each arranged between one of said data input/output circuits and another one of said data input/output circuits to transfer data transmitted by said N write data lines included in said one of said data input/output circuits respectively to said N read data lines included in said another one of said data input/output circuits in an input/output test operation.

7. The semiconductor memory device according to claim 6, further comprising a plurality of second input/output test circuits each arranged between said one of said data input/output circuits and said another one of said data input/output circuits to transfer data transmitted by said N write data lines included in said another one of said data input/output circuits respectively to said N read data lines included in said one of said data input/output circuits in said input/output test operation, wherein said plurality of second input/output test circuits and said plurality of first input/output test circuits operate complementarily.

8. The semiconductor memory device according to claim 7, wherein said plurality of data terminals are divided into two groups depending on data supplied to and from the data terminals, one group associated with high-order bit data and the other group associated with low-order bit data, and said plurality of first and second input/output test circuits are arranged respectively between a plurality of data input/output circuits associated with one of said groups and a plurality of data input/output circuits associated with the other one of said groups.

9. The semiconductor memory device according to claim 7, wherein said plurality of data terminals are divided into a plurality of groups, each of said groups having M data terminals (M: natural number which is at least 2), said plurality of first input/output test circuits are arranged respectively between M data input/output circuits associated with one of said groups and M data input/output circuits associated with another one of said groups, and said plurality of second input/output test circuits are arranged respectively between M data input/output circuits associated with said another one of said groups and said M data input/output circuits associated with said one of said groups.

10. The semiconductor memory device according to claim 9, wherein said data terminals included in the same one of said groups are arranged adjacently to each other.

11. The semiconductor memory device according to claim 6, wherein reading and writing operations of said N data are performed in synchronization with rising and filling edges of an external reference clock.

12. The semiconductor memory device according to claim 6, wherein reading and writing operations of said N data are performed at a frequency equal to or higher than twice a frequency of an external reference clock.

13. A semiconductor memory device internally converting serial supplied from and to any external unit into parallel data and executing reading and writing operations thereof, comprising:

a memory cell array having a plurality of memory cells arranged in rows and columns;

a plurality of data terminals each for independent input and output of N data (N: natural number) transmitted in time series manner;

a control circuit which generates L control signals (L: natural number) for controlling timing of said reading and writing operations; and a plurality of data input/output circuits arranged for said data terminals respectively, each for reading and writing said N data from and into said memory cell array, said data input/output circuits each including:

N write data lines and N read data lines for transmitting said N data in parallel;

a first data conversion circuit which converts N serial data supplied from an associated one of said data terminals into N parallel data to transmit the parallel data to said write data lines;

a second data conversion circuit which converts N parallel data transmitted by said read data lines into N serial output data to be output from said associated data terminal;

a read and write circuit for supplying and receiving said N data between said N write data lines and said memory cell array and between said N read data lines and said memory cell array; and an output buffer circuit for outputting output data of said second data conversion circuit to the associated one of said data terminals in the reading operation, and outputting test data to the associated one of said data terminals in an input/output test operation, the semiconductor memory device further comprising
an input/output test circuit which transmits in said input/output test operation as said test data N data transmitted by said N write data lines included in one of said data input/output circuits and M control signals (M: natural number which is at most L) respectively to said output buffer circuits included respectively in remaining N+M said data input/output circuits among said plurality of data input/output circuits.

14. The semiconductor memory device according to claim 13, wherein said output buffer circuit includes:

a first transmission circuit which transmits said test data to an internal node when said input/output test operation is activated;

a second transmission circuit which transmits said output data of said second data conversion circuit to said internal node when said input/output test operation is inactivated; and a voltage switching circuit which supplies one of first and second voltages to an associated one of said plurality of data terminals according to voltage level of said internal node when execution of one of said reading operation and said input/output test operation is commanded.

15. The semiconductor memory device according to claim 14, wherein said voltage switching circuit includes:

a first transistor arranged for electrically coupling an output node connected to said associated one of data terminals with said first voltage; and a second transistor arranged for electrically coupling said output node with said second voltage, and said voltage switching circuit turns on one of said first and second transistors according to voltage level of said internal node when execution of one of said reading operation and said input/output test operation is commanded.

16. The semiconductor memory device according to claim 13, wherein reading and writing operations of said N data are performed in synchronization with rising and falling edges of an external reference clock.

17. The semiconductor memory device according claim 13, wherein reading and writing operations of said N data are performed at a frequency equal to or higher than twice a frequency of an external reference clock.

18. A semiconductor memory device internally converting serial data suppliedfrom and to any external unit into parallel data and executing reading and writing operations thereof, comprising:

a memory cell array having a plurality of memory cells arranged in rows and columns;

a read circuit for reading N data (N: natural number) from said memory cell array;

a write circuit for writing N data into said memory cell array;

N read data lines for transmitting said N data from said read circuit in parallel;

N write data lines for transmitting said N data to said write circuit in parallel;

a first data terminal for inputting said N data transmitted in time series manner;

a second data terminal for outputting said N data transmitted in time series manner;

an input buffer circuit provided correspondingly to said first data terminal, for taking in said N data input through said first data terminal;

an output buffer circuit provided correspondingly to said second data terminal, for outputting said N data to the external unit through said second data terminal;

a first data conversion circuit converting N serial data supplied from said input buffer circuit into N parallel data to output the parallel data to said N write data lines respectively;

a second data conversion circuit converting N parallel data transmitted by said N read data lines into N serial output data to output the serial data to said output buffer circuit; and an input/output test circuit connected between said N read data lines and said N write data lines, for transferring N data transmitted by said N write data lines to said N read data line respectively, in response to an input/output test signal.

19. The semiconductor memory device according to claim 18, wherein
said first and second data terminals are the same.

20. The semiconductor memory device according to claim 18, wherein
said first and second data terminals are different.

21. The semiconductor memory device according to claim 18, wherein
said input/output test circuit includes N transfer circuits provided between said N read data lines and N write data lines, respectively,
each of said N transfer circuits includes
a first latch circuit for latching data transmitted on a corresponding one of said N write data lines,
a first transfer gate connected to said first latch circuit, and attaining ON state in response to inactivation of said input/output test signal,
a second latch circuit for latching an output of said first transfer gate, and
a second transfer gate connected between said second latch circuit and a corresponding one of said N read data lines, and attaining ON state in response to activation of said input/output test signal.

22. The semiconductor memory device according to claim 18, further comprising an internal clock generating circuit receiving an external reference clock signal to generate an internal clock signal having a frequency equal to or higher than twice a frequency of said external reference clock signal, wherein
said input buffer circuit and said output buffer circuit control data according to said internal clock signal.

23. A semiconductor memory device comprising:
a memory cell array having a plurality of memory cells arranged in rows and columns;
a read circuit for reading N data (N: natural number) from said memory cell array;
write circuit for writing N data (N: natural number) into said memory cell array;
N read data lines for transmitting said N data from said read circuit;
N write data lines provided independent of said N read data lines, for transmitting said N data to said write circuit; and
N data transmit circuit provided between said N read data lines and said N write data lines, respectively, for transmitting N data transmitted by said N write data lines to said N read data lines, in response to a predetermined signal.

24. The semiconductor memory device according to claim 23, wherein said predetermined signal is an input/output test signal.

25. The semiconductor memory device according to claim 23, wherein each of said N data transmit circuit includes a register circuit.

26. The semiconductor memory device according to claim 25, wherein
said register circuit includes:
a first latch circuit for latching data transmitted on a corresponding one of said N write data lines;
a first transfer gate connected to said first latch circuit, and attaining ON state in response to inactivation of said predetermined signal;
a second latch circuit for latching an output of said first transfer gate; and
a second transfer gate connected between said second latch circuit and a corresponding one of said N read data lines, and attaining ON state in response to activation of said predetermined signal.

27. The semiconductor memory device according to claim 23, further comprising:
a data input circuit for receiving said N data from an external unit and transmitting said N data to said N write data lines; and
a data output circuit for receiving said N data from said N read data lines and outputting said N data to an external unit.

* * * * *